(12) United States Patent
Wigglesworth et al.

(10) Patent No.: US 8,558,109 B2
(45) Date of Patent: Oct. 15, 2013

(54) SEMICONDUCTOR COMPOSITION FOR HIGH PERFORMANCE ORGANIC DEVICES

(75) Inventors: Anthony J. Wigglesworth, Oakville (CA); Yiliang Wu, Oakville (CA)

(73) Assignee: Xerox Corporation, Norwalk, CT (US)

(*) Notice: Subject to any disclaimer, the term of this patent is extended or adjusted under 35 U.S.C. 154(b) by 0 days.

(21) Appl. No.: 13/424,204

(22) Filed: Mar. 19, 2012

(65) Prior Publication Data

US 2013/0240792 A1  Sep. 19, 2013

(51) Int. Cl.
*H01L 31/00* (2006.01)
(52) U.S. Cl.
USPC ...... 136/263; 526/256; 257/40; 257/E51.005; 257/E51.018
(58) Field of Classification Search
USPC ............ 136/263; 526/256; 257/40, E51.005, 257/E51.018
See application file for complete search history.

(56) References Cited

U.S. PATENT DOCUMENTS

| | | | |
|---|---|---|---|
| 6,107,117 A | 8/2000 | Bao et al. | |
| 6,451,459 B1* | 9/2002 | Tieke et al. | 428/690 |
| 7,194,173 B2 | 3/2007 | Shtein et al. | |
| 7,425,723 B2 | 9/2008 | Ong et al. | |
| 7,910,684 B2 | 3/2011 | Li | |
| 7,919,573 B2 | 4/2011 | Li et al. | |
| 7,919,574 B2 | 4/2011 | Li et al. | |
| 7,932,344 B2 | 4/2011 | Li | |
| 2007/0079867 A1 | 4/2007 | Chittibabu et al. | |
| 2007/0272296 A1 | 11/2007 | Brabec et al. | |
| 2009/0065878 A1 | 3/2009 | Li | |
| 2009/0278116 A1 | 11/2009 | Yamate | |
| 2010/0066950 A1 | 3/2010 | Cho et al. | |
| 2011/0215313 A1 | 9/2011 | Duggeli et al. | |
| 2011/0284082 A1* | 11/2011 | Kim et al. | 136/263 |

FOREIGN PATENT DOCUMENTS

WO  WO 2004/112161  12/2004

OTHER PUBLICATIONS

Wu et al. (Chem. Mater. 2011, 23, 4618-4624).*
McCulloch, I., et al., Liqiud-crystakkine semiconducting polymers with high charge-carrier mobility, Nat. Mater. 5, 328-333 (2006).

(Continued)

*Primary Examiner* — Shane Fang
(74) *Attorney, Agent, or Firm* — Oliff & Berridge, PLC

(57) ABSTRACT

A copolymer having a structure represented by:

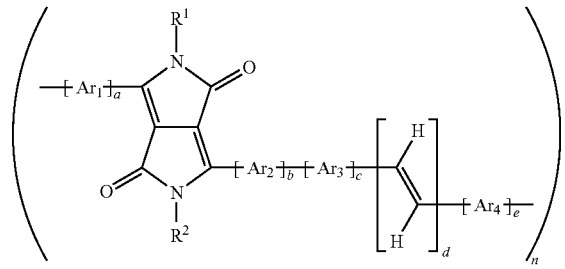

wherein $R^1$ and $R^2$ are independently selected from a hydrogen, a substituted or unsubstituted alkyl group, a substituted or unsubstituted aryl group, or a substituted or unsubstituted heteroaryl group; $Ar_1$ and $Ar_2$ are independently an aromatic or heteroaromatic group including about 4 to about 30 carbon atoms, and can be optionally substituted; a and b are independently an integer from 1 to about 4; $Ar_3$ and $Ar_4$ are independently an aromatic or heteroaromatic group comprising about 4 to about 20 carbon atoms, and can be optionally substituted; c and e are independently an integer from about 0 to about 2; d is 1 to 4 and the carbon-carbon double bond is in the E-configuration; and n represents a number from 2 to about 5,000.

21 Claims, 3 Drawing Sheets

(56) References Cited

OTHER PUBLICATIONS

Huo, Lijun, et al., Bandgap and Molecular Level Control of the Low-Bandgap Polymers Based on 3,6-Dithiophen2-yl-2,5-dihydropyrrolol[3,4-c]pyrrole-1,4-dione toward Highly Efficient Polymer Solar Cells, *Macromolecules*. 42, 6564-6571 (2009).
Hadipour, Afshin, et al., Solution-Processed Organic Tandem Solar Cells, Adv. Funct. Mater. 16, 1897-1903 (2006).
Gilot, Jan, et al., Double and triple junction polymer solar cells processed from solution, App. Phys. Let. 90, 143512 (2007).
U.S. Appl. No. 13/424,221, filed Mar. 19, 2012.
Office Action dated Mar. 14, 2013 in U.S. Appl. No. 13/424,221.
Online dictionary (Mercury lamp, 1979).
Office Action issued Jun. 5, 2013 in U.S. Appl. No. 13/728,148.

* cited by examiner

SEMICONDUCTOR COMPOSITION FOR HIGH PERFORMANCE ORGANIC DEVICES

BACKGROUND

Described herein are diketopyrrolopyrrole (DPP) copolymers such as small molecules, oligomers, and semiconducting copolymers based thereon. These molecules may find application in semiconductor layers of electronic devices such as organic thin film transistors (OTFTs) and in organic photovoltaics (solar cells).

Thin film transistors (TFTs) are basic components of many electronic devices, including sensors, image scanners, and electronic display devices. OTFTs offer advantages over conventional, silicon-based materials in that manufacturing costs can be reduced as well as providing mechanical properties such as the devices being physically compact, lightweight, and flexible. OTFTs are generally composed of a supporting substrate, three electrically conductive electrodes (gate, source and drain electrodes), a channel semiconductor layer, and an electrically insulating gate dielectric layer separating the gate electrode from the source and drain electrodes. The channel semiconductor is in turn in contact with the source and drain electrodes. The materials used to make the OTFTs, and the interfacial properties between various layers of semiconductor, dielectric, and electrodes can all affect the performance of the OTFTs.

DPP copolymers are high mobility p-type semiconductors which have been used for thin film transistors. However, due to the relatively high HOMO (highest occupied molecular orbital) energy level of these materials, most of them are sensitive to oxygen and therefore not suitable for fabrication of devices under ambient conditions.

For most semiconductors, if their HOMO level is not well matched with the work function of the electrode material, a significantly lower mobility is often observed in bottom contact devices due to a larger charge injection barrier.

Thieno[3,2-b]thiophene-based copolymers have shown high charge carrier mobility of 0.2-0.6 cm$^2$/Vs (see, for example, McCulloch, I., et al. *Nat. Mater.* 5, 328 (2006)). However, these copolymers have shown some sensitivity towards oxygen and moisture in air, thus hampering their solution fabrication of TFTs in ambient conditions.

U.S. Pat. No. 7,910,684, incorporated herein by reference in its entirety, discloses a thin film transistor device comprising: a semiconductor layer, the semiconductor layer comprising a compound comprising a chemical structure represented by:

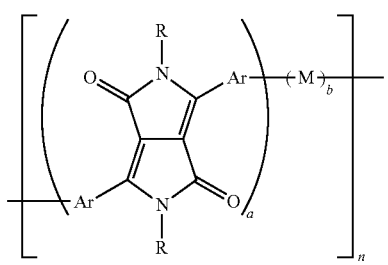

wherein each R is independently selected from hydrogen, an optionally substituted hydrocarbon, and a hetero-containing group; each Ar is independently selected from optionally substituted heteroaryl groups; each M is a conjugated moiety selected from:

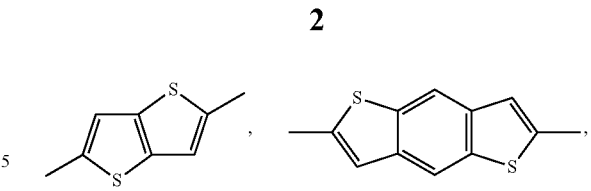

and substituted derivatives and combinations thereof; a represents a number that is at least 1; b represents a number from 1 to 20; and n represents a number that is at least 1.

U.S. Pat. No. 7,932,344, incorporated herein by reference in its entirety, discloses a copolymer comprising a structure represented by:

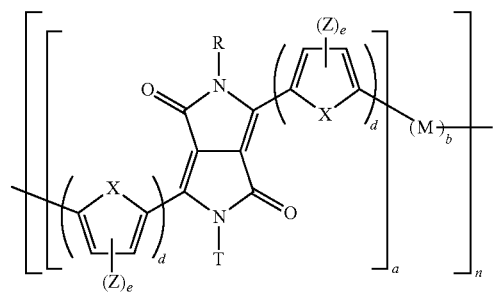

wherein each R is independently selected from hydrogen, an optionally substituted hydrocarbon, and a hetero-containing group; each M is a conjugated moiety selected from:

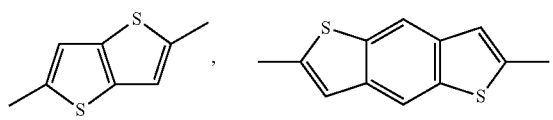

and substituted derivatives and combinations thereof; a represents a number that is at least 1; b represents a number from 1 to 20; n represents a number from 2 to 5,000; each X is independently selected from S, Se, O, and NR", where each R" is independently selected from hydrogen, an optionally substituted hydrocarbon, and a hetero-containing group; each Z is independently one of an optionally substituted hydrocarbon, a hetero-containing group, and a halogen; d represents a number which is at least 1; and e represents a number from zero to 2.

U.S. Patent Application Publication No. 2011/0215,313, and Huo, Lijun, et al. *Macromolecules.* 42, 6564-6571 (2009), both incorporated herein by reference in their entireties, disclose DPP copolymers in organic photovoltaic devices.

There is a need for materials and methods that will improve air stability of the semiconductor layer while providing high charge carrier mobility.

SUMMARY

The above and other objects are achieved herein, the present disclosure describing a copolymer comprising a structure represented by:

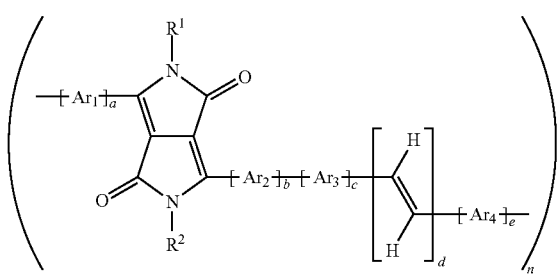

wherein $R^1$ and $R^2$ are independently selected from a hydrogen, a substituted or unsubstituted alkyl group, a substituted or unsubstituted aryl group, or a substituted or unsubstituted heteroaryl group, $Ar^1$ and $Ar_2$ are independently an aromatic or heteroaromatic group comprising about 4 to about 30 carbon atoms, and can be optionally substituted, "a" and "b" are independently an integer from 1 to about 4, $Ar_3$ and $Ar_4$ are independently an aromatic or heteroaromatic group comprising about 4 to about 20 carbon atoms, and can be optionally substituted, "c" and "e" are independently an integer from about 0 to about 2, "d" is about 1 to about 4 wherein the carbon-carbon double bond is in the E-configuration, and "n" represents a number from 2 to about 5,000.

Also described is a method of forming a copolymer comprising, mixing a first compound of the formula:

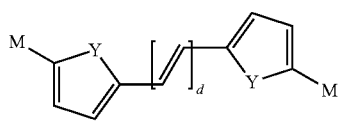

wherein the carbon-carbon double bond is in the E-configuration, d represents a number from 1 to about 4, and M represents:

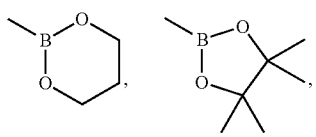

$Sn(Me)_3$, $Sn(Bu)_3$, or $B(OH)_2$, wherein B represents boron, with a second compound

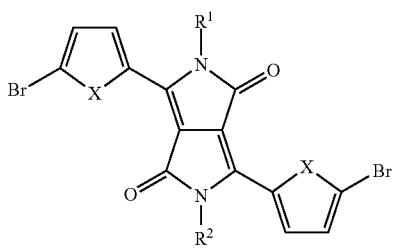

of the formula:
wherein, $R^1$ and $R^2$ are independently selected from a hydrogen, a substituted or unsubstituted alkyl group, a substituted or unsubstituted aryl group, or a substituted or unsubstituted heteroaryl group, X and Y are independently selected from O, S or Se, in an environment that is substantially free of oxygen gas; adding a solvent that is substantially free of oxygen gas to dissolve the mixture; adding an aryl bromide or heteroaryl bromide to the mixture and allowing the first compound to react with the second compound to form the copolymer; collecting the copolymer; and purifying the copolymer.

Also described is an electronic device comprising a copolymer represented by the structure:

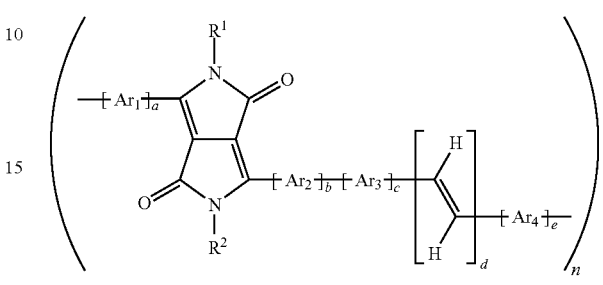

wherein $R_1$ and $R_2$ are independently selected from a hydrogen, a substituted or unsubstituted alkyl group, a substituted or unsubstituted aryl group, or a substituted or unsubstituted heteroaryl group, $Ar_1$ and $Ar_2$ are independently an aromatic or heteroaromatic group comprising about 4 to about 30 carbon atoms, and can be optionally substituted, a and b are independently an integer from about 1 to about 4, $Ar_3$ and $Ar_4$ are independently an aromatic or heteroaromatic group comprising about 4 to about 20 carbon atoms, and can be optionally substituted, c and e are independently an integer from about 0 to about 2, d is 1 to 4 and the carbon-carbon double bond is in the E-configuration, and n represents a number from 2 to about 5,000.

EMBODIMENTS

Figure 1:
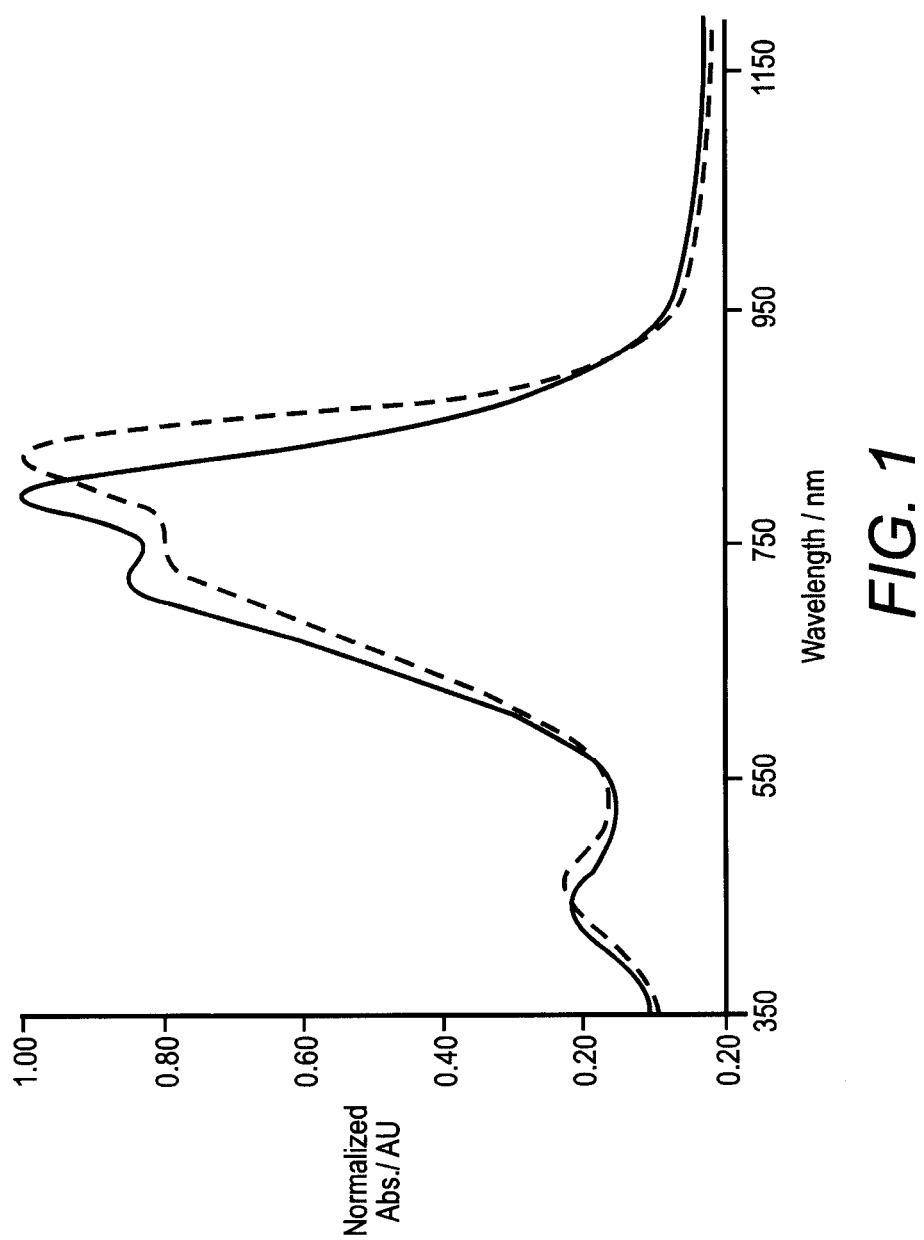
FIG. 1 is a graph comparing the absorption spectra of a copolymer in the E-configuration to a copolymer with no double bond in the repeat unit.

The copolymers herein are based on diketopyrrolopyrrole (DPP) (pyrrolo[3,4-c]pyrrole-1,4-dione) connected to a substituted five-membered heterocyclic compound containing at least one vinyl group in the repeat unit, copolymeric materials based on such compounds, and to methods for the use of DPP as a building block for forming such copolymeric materials. Such materials are suitable for use as semiconductors, such as for OTFTs and photovoltaic devices. The highly conjugated DPP-based copolymers provide a p-type semiconductor material which has advantages over conventional semiconductor materials. In particular, the electron-withdrawing nature of DPP, its highly conjugated, fused ring structure, and at least one vinyl group in the E-configuration in the repeat unit, enhances the charge carrier mobility of the semiconductor materials disclosed herein. The addition of at least one vinyl group in the repeat unit of the polymer gives rise to an increase in the absorption maxima of the polymer leading to increased performance, for example, in solar cell applications. For example, the copolymers disclosed herein provide for increased stability and performance over poly 3-hexylthiophene (P3HT)

In various aspects, specific molecules and copolymers disclosed herein, comprise a copolymer

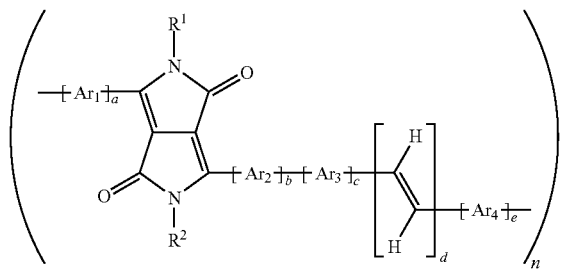

wherein $R^1$ and $R^2$ are independently selected from a hydrogen, a substituted or unsubstituted alkyl group, a substituted or unsubstituted aryl group, or a substituted or unsubstituted heteroaryl group, $Ar_1$ and $Ar_2$ are independently an aromatic or heteroaromatic group comprising about 4 to about 30 carbon atoms, and can be optionally substituted, "a" and "b" are independently an integer from 1 to about 4; $Ar_3$ and $Ar_4$ are independently an aromatic or heteroaromatic group comprising about 4 to about 20 carbon atoms, and can be optionally substituted, "c" and "e" are independently an integer from 0 to about 2; "d" is 1 to 4 and the carbon-carbon double bond is in the E-configuration, and "n" represents a number from 2 to about 5,000, such as, from about 10 to about 2,500, or from about 100 to about 1,000.

Each repeat unit "n" can be the same repeat unit or a different repeat unit. However, for a semiconductor copolymer, a regular or substantially regular repeat unit "n" is generally more advantageous for a high charge mobility.

For the $R^1$ and $R^2$ groups, example hydrocarbons may include any suitable, optionally substituted, hydrocarbon group. The optionally substituted hydrocarbon group contains for example from 1 to about 50 carbon atoms, such as from 4 to about 20 carbon atoms, and may be selected from, for example, a straight chain alkyl group, a branched alkyl group, a cycloalkyl group, an aryl group, an alkylaryl group, and an arylalkyl group.

Herein, "substituted" refers, for example, to the replacement of one or more of the hydrogens with an alkyl, aryl, alkylaryl, halogen, hydroxyl group, hetero-containing group, such as heteroaryl, and combinations thereof, and the like.

The term "alkyl" refers, for example, to a radical composed entirely of carbon atoms and hydrogen atoms that is fully saturated and of the formula —$C_nH_{2n+1}$. The alkyl radical may be linear, branched, or cyclic, and contain from about 3 to about 50 carbon atoms, from about 4 to about 40 carbon atoms, from about 5 to about 36 carbon atoms and from about 8 to about 24 carbon atoms. Example alkyl groups suitable for $R^1$ and $R^2$ include, for example, methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof. The alkyl group is optionally substituted one or more times with, for example, a halogen (chlorine, bromine, fluorine, and iodine) or a heteroatom-containing group, for example, S, Se, O, or N, or a mixture thereof. Example substituents for alkyl groups suitable for $R^1$ and $R^2$ may include a nitrogen containing moiety, an alkoxy group, a heterocyclic system, an alkoxyaryl, and an arylalkoxy.

The term "aryl" refers, for example, to an aromatic radical composed entirely of carbon atoms and hydrogen atoms. When aryl is described in connection with a numerical range of carbon atoms, it should not be construed as including substituted aromatic radicals. For example, the phrase "aryl containing from 6 to 10 carbon atoms" should be construed as referring to a phenyl group (6 carbon atoms) or a naphthyl group (10 carbon atoms) only, and should not be construed as including a methylphenyl group (7 carbon atoms). However, the aryl group may be substituted with additional substituents such as an alkyl group, an alkoxy group, an alkylthio group, a cyano group and a halogen. Example aryl groups are aromatic hydrocarbon groups (including alkoxyaryl and alkylaryl groups) having 6 to 500 carbon atoms, and which are suitable for $R^1$ and $R^2$, include, for example, phenyl, polyphenyl, and naphthyl; alkoxyphenyl groups, such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl, and combinations thereof.

The term "heteroaryl" refers, for example, to an aromatic radical composed of carbon atoms, hydrogen atoms, and one or more heteroatoms. The carbon atoms and the heteroatoms are present in a cyclic ring or backbone of the radical. The heteroatoms are selected from S, Se, O, or N. The heteroaryl group may have, for example, 5 to about 120 atoms, or from 10 to about 80 atoms. Heteroaryl groups may be, for example, oxazole, isoxazole, pyridine, thiazole, isothiazole, imidazole, triazole, pyrazole, furazan, thiadiazole, oxadiazole, pyridazine, pyrimidine, pyrazine, indole, isoindole, indazole, chromene, quinoline, isoquinoline, cinnoline, quinazoline, quinoxaline, naphthylidine, phthalazine, purine, pteridine, thienofuran, imidazothiazole, benzofuran, benzothiophene, benzoxazole, benzthiazole, benzthiadiazole, benzimidazole, imidazopyridine, pyrrolopyridine, pyrrolopyrimidine, pyridopyrimidine, thiophene, furan, or pyrrole and combinations thereof.

$Ar_1$ and $Ar_2$ are independently an aromatic or heteroaromatic group comprising about 4 to about 30 carbon atoms, and can be optionally substituted as described above. $Ar_1$ and $Ar_2$ can be the same or can be different. For example, $Ar_1$ and $Ar_2$ may be:

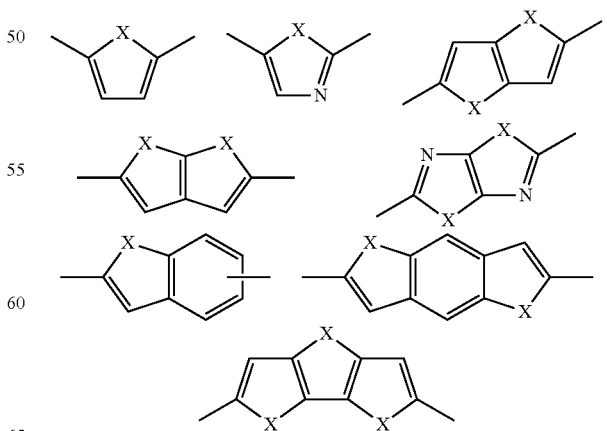

wherein "X" is independently, for example, an O, S or Se.

$Ar_3$ and $Ar_4$ are independently an aromatic or heteroaromatic group comprising about 4 to about 20 carbon atoms, and can be optionally substituted as described above. $Ar_3$ and $Ar_4$ can be the same or can be different. For example, $Ar_3$ and $Ar_4$ may be:

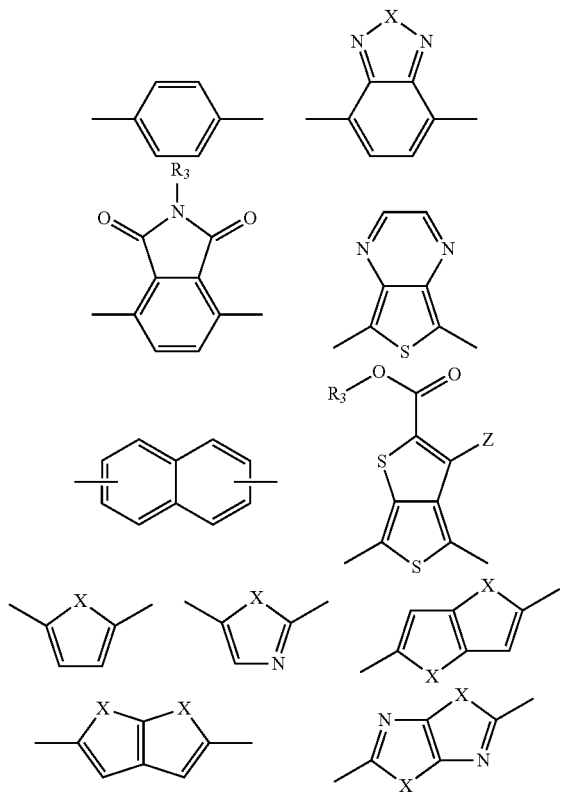

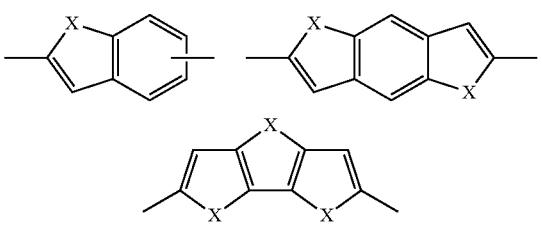

wherein "X" is independently, for example, an O, S or Se, "Z" is, for example, a H or F, and $R_3$ is an alkyl or substituted alkyl group, as described above.

For example, the copolymer may be of the formula:

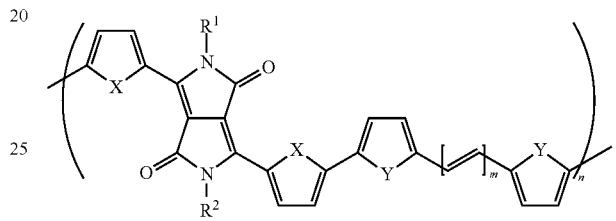

wherein, $R^1$ and $R^2$ are independently selected from a hydrogen, a substituted or unsubstituted alkyl group, a substituted or unsubstituted aryl group, or a substituted or unsubstituted heteroaryl group; X and Y are independently selected from O, S or Se; m represents a number between 1 and about 4, wherein the carbon-carbon double bond is in the E-configuration; and n represents a number from 2 to about 5,000, or the copolymer may be selected from the group consisting of:

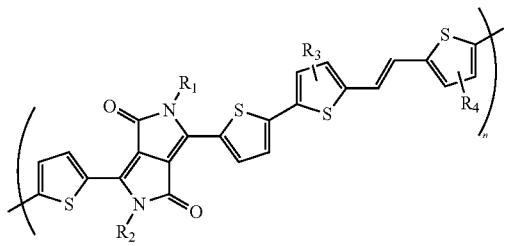

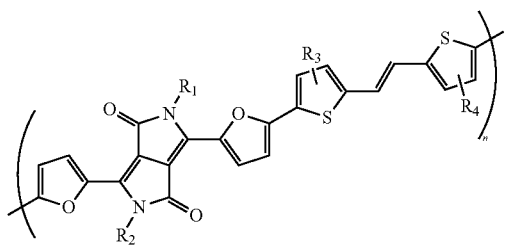

-continued
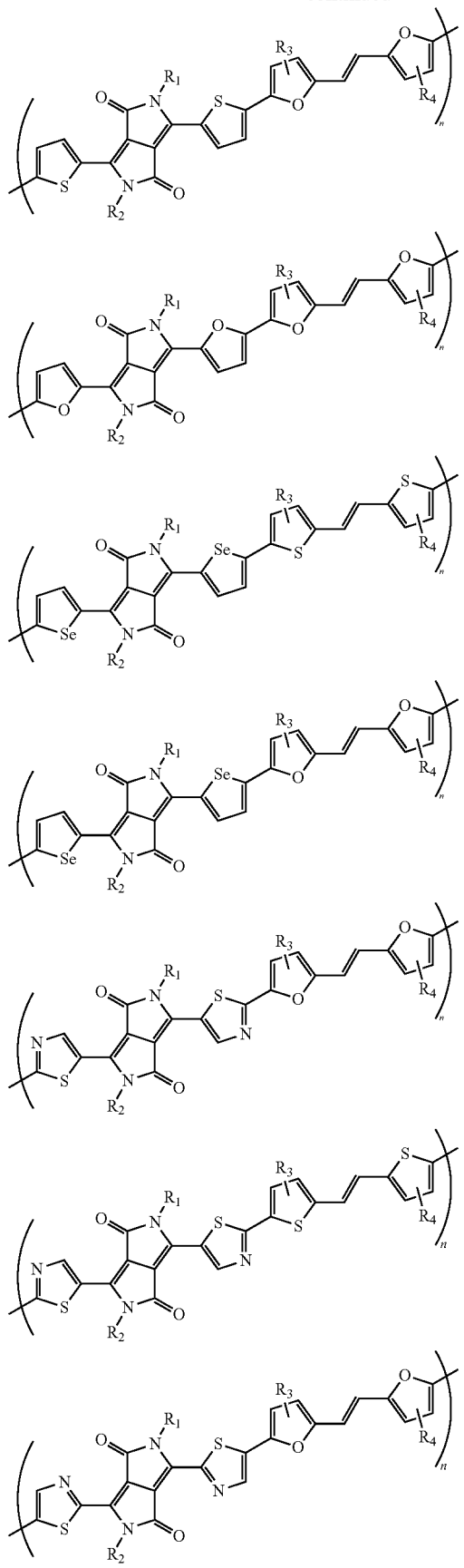

-continued
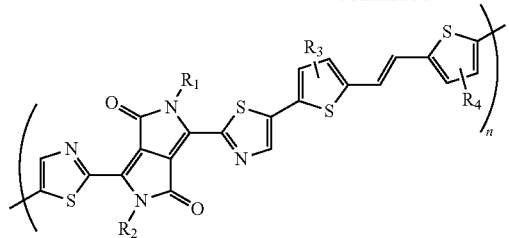
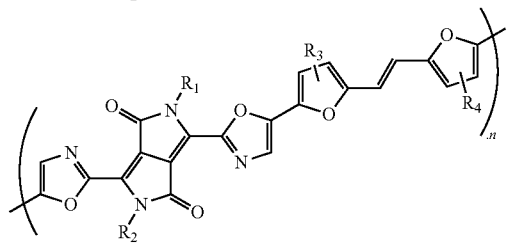
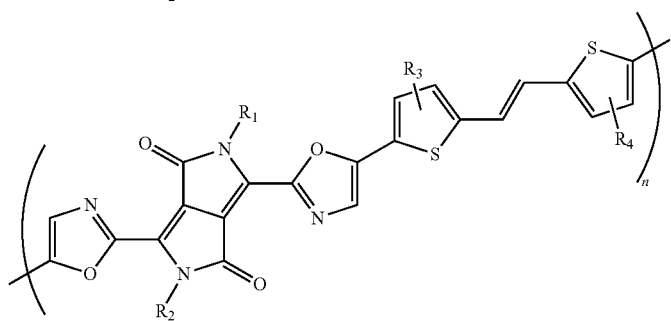
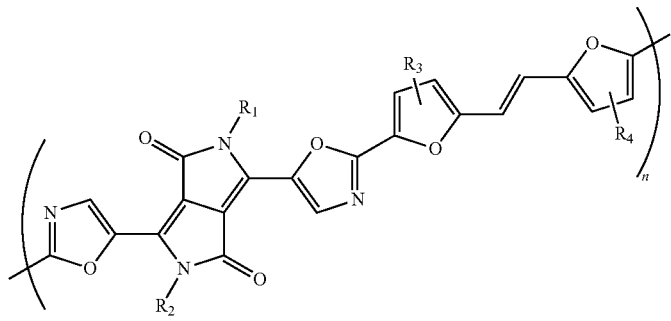
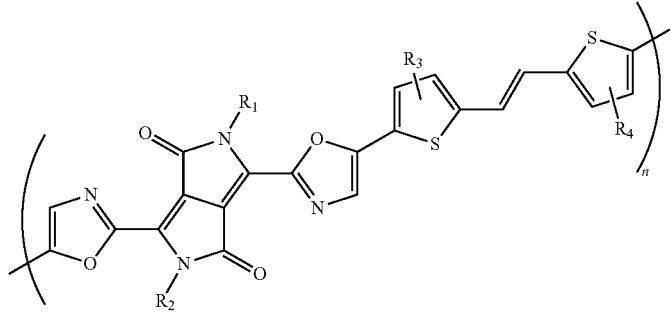
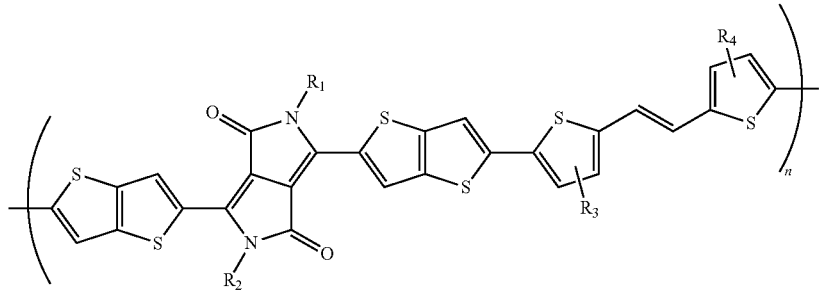

-continued

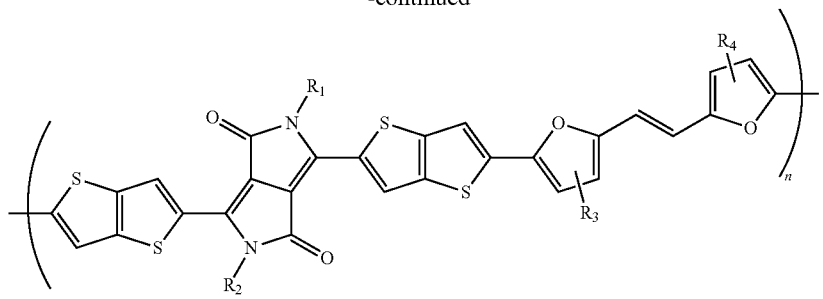

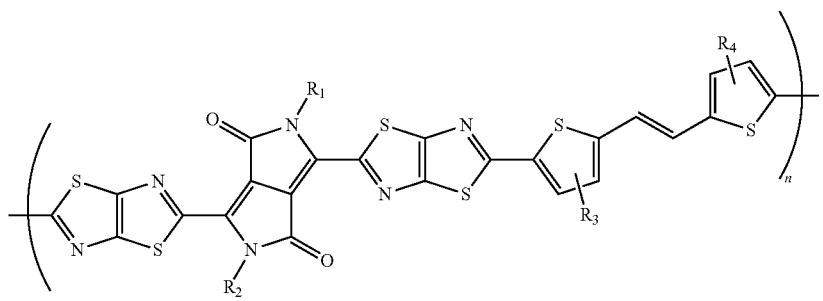

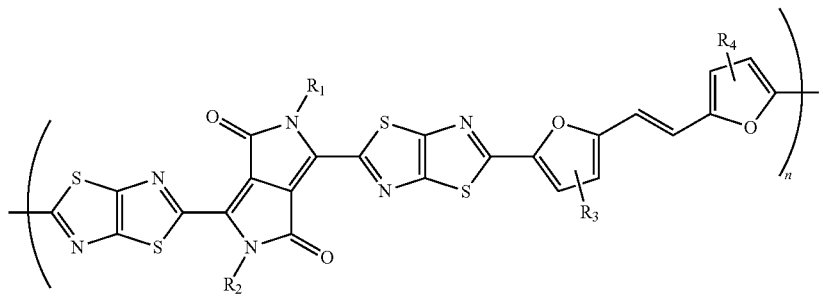

The carbon-carbon double bond in the E-configuration helps to increase charge transport along the backbone of the copolymer. For example, depicted below is the structure of (Z)-1,2-di(thiophen-2-yl)ethane (left) and (E)-1,2-di(thiophen-2-yl)ethane (right). In the Z-configuration, the hydrogen atoms in the 3-positon of the thiophene ring have a negative steric interaction which forces the molecule into a twisted, non-planar structure, which in a conjugated copolymer would disrupt charge transport leading to a decrease in performance in, for example, a semiconductor. In the E-configuration, the thiophene substituents are coplanar which maximizes the charge transport along the copolymer backbone and increases material performance when compared to the Z-isomer.

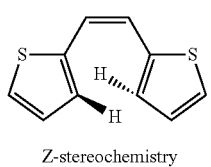

Z-stereochemistry

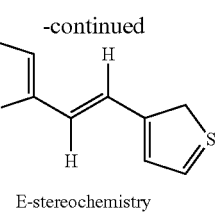

E-stereochemistry

For example, as shown in FIG. 1, the addition of the double bond in the E-configuration helps fine-tune the electronic structure of the copolymer and leads to a red shift in the absorption maximum of the copolymer compared to structural analogue that does not contain a carbon-carbon double bond in the repeat unit. The copolymer which contains the carbon-carbon double bond in the E-configuration is red-shifted by about 30 nm (dashed line) compared to a control sample (solid line) with no double bond in the repeat unit.

In embodiments, a process for forming the copolymers includes, for example, utilizing the Stille polycondensation or the Suzuki-Miyaura polycondensation method and end-capped with bromothiophene. For example, the method includes mixing a first compound of the formula:

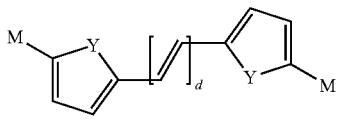

wherein M is:

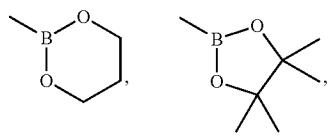

$Sn(Me)_3$, $Sn(Bu)_3$, or $B(OH)_2$, wherein B represent boron, with a second compound of the formula:

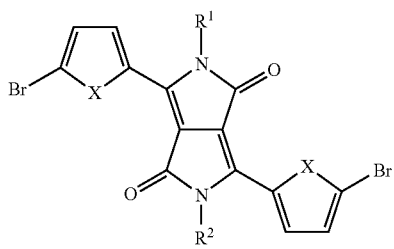

wherein, $R^1$ and $R^2$ are independently selected from a hydrogen, a substituted or unsubstituted alkyl group, a substituted or unsubstituted aryl group, or a substituted or unsubstituted heteroaryl group, X and Y are independently selected from O, S or Se, and d represents a number from 1 to about 4, wherein the carbon-carbon double bond is in the E-configuration, and in an environment that is substantially free of oxygen gas, adding a solvent that is substantially free of oxygen gas to dissolve the mixture; adding an aryl bromide or heteroaryl bromide, for example, 2-bromothiophene to the mixture and allowing the first compound to react with the second compound to form the copolymer; and collecting and optionally purifying the product from the reaction mixture.

For example, the method may include mixing a first compound of the formula:

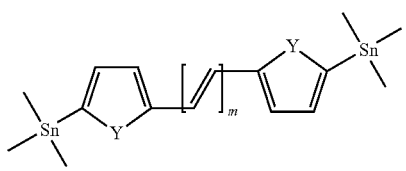

with a second compound of the formula:

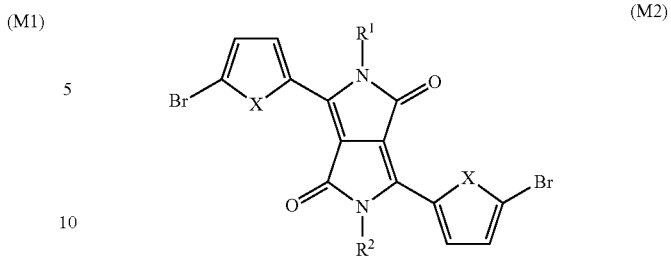

wherein, $R^1$ and $R^2$ are independently selected from a hydrogen, a substituted or unsubstituted alkyl group, a substituted or unsubstituted aryl group, or a substituted or unsubstituted heteroaryl group, X and Y are independently selected from O, S or Se, and m represents a number from 1 and about 4, in an environment that is substantially free of oxygen gas, adding a solvent that is substantially free of oxygen gas to dissolve the mixture; adding a Pd-catalyst; heating the mixture at or below the boiling point of the solvent; adding an aryl bromide or heteroaryl bromide to the mixture and allowing the copolymer to react with the capping group; isolating the copolymer; and optionally purifying the copolymer.

Additionally, the method may include, for example, mixing a first compound of the formula:

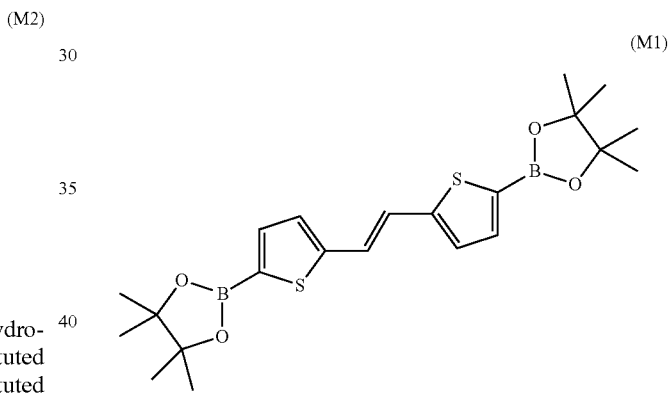

with a second compound of the formula:

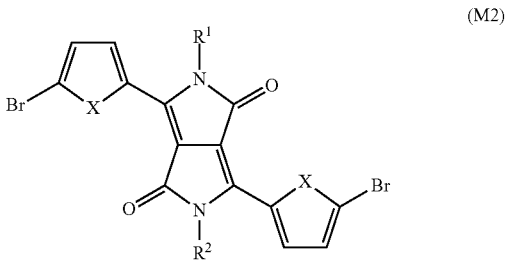

wherein, $R^1$ and $R^2$ are independently selected from a hydrogen, a substituted or unsubstituted alkyl group, a substituted or unsubstituted aryl group, or a substituted or unsubstituted heteroaryl group, X is independently selected from O, S or Se, and m represents a number from 1 and about 4, in an environment that is substantially free of oxygen gas, adding a solvent that is substantially free of oxygen gas to dissolve the mixture; adding a base, for example, $K_2CO_3$, $Cs_2CO_3$, $K_3PO_4$, KF, CsF, and the like, or mixtures thereof, optionally adding a phase transfer catalyst, for example, tetrabutylammonium hydride; adding a Pd-catalyst; heating the mixture at or below the boiling point of the solvent; adding an aryl-bromide or heteroaryl bromide to the mixture and allowing the copolymer to react with the capping group; isolating the copolymer; and optionally purifying the copolymer.

The first compound (M1) may be included in about equal molar amounts with the second compound (M2).

The oxygen may be removed from the environment, for example, by flushing the reaction vessel with an inert gas, for example, argon.

Any solvent or solvent mixture suitable to dissolve the first and second compound may be used. For example, the solvent may be selected from toluene, xylenes, N,N-dimethylformamide, N,N-dimethylacetamide, N-methylpyrollodinone, tetrahydrofuran, dioxanes, water and the like, or mixtures thereof. The oxygen may be removed from the solvent by, for example, bubbling an inert gas, for example, argon, through the solvent.

Before the addition of aryl bromide or heteroaryl bromide to the dissolved mixture, a catalyst may be added to the mixture. A catalyst is any substance that increases a chemical reaction rate without itself being consumed or undergoing a chemical change. Any suitable catalyst may be used, for example, a tetrakis(triarylphosphonium)-palladium catalyst, such as, for example, tetrakis(triphenylphosphine)palladium (0) (Pd(PPh$_3$)$_4$), Pd(PPh$_3$)$_2$Cl$_2$, PdOAc$_2$, Pd(dba)$_3$:P(o-Tol)$_3$, and the like, or derivatives thereof. The catalyst may be added in any amount that increases the chemical reaction rate, such as from about 0.1 mol. % to about 10 mol % of a palladium catalyst, or from about 1 mol. % to about 5 mol %, or for example in a molar ratio of, for example, in a monomer to catalyst ratio, in the range of, for example, from about 1,000:1 to about 10:1, such as from about 100:1 to about 30:1.

In addition, before or after the addition of a catalyst, but before the addition of an aryl bromide or heteroaryl bromide, the mixture may be heated to a temperature of about 70° C. to about 180° C., such as from about 90° C. to about 110° C. The reaction may be agitated at the elevated temperature by any means, such as shaking or stirring, and may be agitated for a time period, for example, for about 24 hours, before adding the aryl bromide or heteroaryl bromide.

The aryl bromide or heteroaryl bromide may be added in any amount that causes end capping of the copolymer and terminates the polymerization reaction. After the addition of an aryl bromide or heteroaryl bromide to the mixture, the mixture is allowed to react. The mixture may be agitated for an additional time period, such as for about 30 minutes to about 5 hours, for about 45 minutes to about 4 hours, or from about 1 hour to about 3 hours, to decrease the reaction time. Allowing the mixture to react results in the formation of the end-capped copolymer.

The copolymer may be collected from the mixture and then may optionally be purified. For example, the mixture may be first poured into a solution of methanol and deionized water. The solution may contain about 5% by volume of deionized water and about 95% by volume of methanol, or from about 10% by volume of deionized water to about 90% by volume of methanol. The copolymer may be collected by any method, for example, by vacuum filtration.

Optionally, the copolymer solution may be treated with a chelating agent or adsorbent to remove any residual palladium catalyst from the final copolymer.

Optionally, the copolymer may be purified to remove impurities and low molecular weight oligomers. The copolymer may be purified by Soxhlet extraction with, for example, methanol, acetone, and hexanes.

The stereochemistry of the final copolymer is dictated by the stereochemistry of the compound (M1).

The copolymer described herein may be incorporated into a device comprising a semiconductor layer, wherein the copolymer comprises at least part of the semiconducting layer. For example, the copolymer may be included into a semiconducting layer according to the methods and devices disclosed in U.S. Pat. Nos. 7,910,684 and 7,932,344, incorporated herein by reference in their entirety.

When incorporating the copolymer into, for example, a semiconducting layer or an active layer of a photovoltaic device, the copolymer is used in a substantially purified form. For example, the copolymer may be in the range of about 90% to about 100% pure, from about 95% to about 100% pure, or from about 97% to about 100% pure, with the remaining percentage being impurities. The copolymer may comprise from about 30% to about 100%, such as, from about 40% to about 85%, or from about 50% to about 70% of the semiconducting layer or an active layer.

In addition, when incorporating the copolymer into, for example, a semiconductor layer or an active layer of a photovoltaic device, the copolymer may first be dissolved in any suitable solvent, for example, chlorobenzene, chlorotoluene, trichlorobenzene, dichlorobenzene, tetrachloroethane, trichloroethane, chloroform, and the like or mixtures, to form a solution. The polymer may comprise about 0.1 to about 5 wt % of the solution, such as from about 0.2 to about 2 wt % of the solution, or from about 0.2 to about 0.8 wt % of the solution. The solution may be optionally heated and agitated, for example, by shaking or stirring, in order to decrease the time necessary to dissolve the polymer in the solvent.

Figure 2:
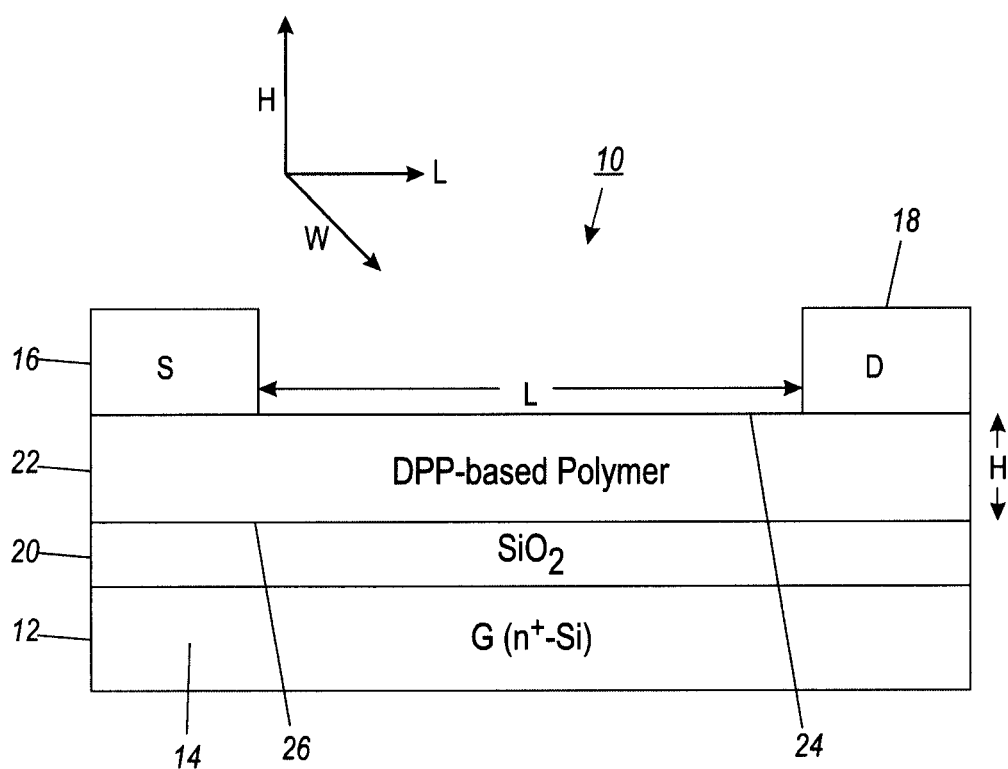
FIG. 2 is a cross sectional view of an example OTFT having a semiconductor layer in accordance using a DPP copolymer.

FIG. 2 illustrates an example configuration of a top contact OTFT 10 which may be formulated with DPP-based compounds. The copolymer may be included in other types of OTFTs, for example, in a bottom contact OTFT. In a bottom contact OTFT, a gate electrode is formed at a lower portion of an organic semiconductor and source and drain electrodes contact the organic semiconductor at the bottom of the organic semiconductor. In contrast, in the top contact OTFT, source and drain electrodes contact the organic semiconductor at the top of the organic semiconductor.

The OTFT 10 comprises a substrate 12, gate, source, and drain electrodes 14, 16, and 18, respectively, a dielectric layer 20, and a semiconductor layer 22. Substrate 12 comprises or is in contact with gate electrode 14. Although in the illustrated embodiment, the gate electrode 14 is depicted as being wholly within the substrate 12 (the entire substrate serves as the gate electrode in this embodiment), this is not required; the key is that the dielectric layer 20 separates the gate electrode 14 from the source electrode 16, drain electrode 18, and the semiconductor layer 22. In other embodiments, gate electrode 14 may be formed as a channel in substrate 12, for example, by doping a portion of the substrate, or may be formed as a surface layer on the substrate 12.

The illustrated semiconductor layer 22 has opposed first and second planar surfaces 24, 26. The source electrode 16 contacts the semiconductor layer 22. The drain electrode 18 also contacts the same surface 24 of the semiconductor layer 22. The semiconductor layer 22 runs over the dielectric layer 20 and extends between the source and drain electrodes 16 and 18. The OTFT device includes a semiconductor channel with a width W and length L (perpendicular to the page in FIG. 2).

The semiconductor layer may be annealed at any suitable temperature that does not damage the copolymer, such as about 140° C. for 10-15 min.

Other configurations of an OTFT in which the exemplary semiconductor layer 22 may be employed are disclosed, for example, in above-mentioned U.S. Pat. Nos. 7,919,573, 7,919,574 and 7,425,723, the disclosures of which are incorporated herein in their entireties, by reference.

In one example, where the substrate 12 also serves as the gate electrode 14, the substrate may be formed, for example, of a heavily n-doped silicon wafer. In other examples, the substrate 12 may be composed of silicon, glass plate, plastic film or sheet or other suitable substrate material. For structurally flexible devices, a plastic substrate, such as for example polyester, polycarbonate, polyimide sheets and the like may be employed. The thickness of the substrate 12 may be from about 10 micrometers to over 10 millimeters with a representative thickness being from about 50 to about 100 micrometers, especially for a flexible plastic substrate and from about 1 to about 10 millimeters for a rigid substrate, such as glass plate or silicon wafer.

The semiconductor layer 22 has a thickness H ranging for example from about 10 nanometers to about 1 micrometer, for example, from about 20 to about 200 nanometers. The semiconductor channel width W may be, for example, from about 1 micrometers to about 5 millimeters, with a specific channel width being about 5 micrometers to about 1 millimeter. The semiconductor channel length L may be, for example, from about 1 micrometer to about 1 millimeter with a more specific channel length being from about 5 micrometers to about 100 micrometers.

The gate, source, drain and electrodes 14, 16, 18 can be made of any suitable electrically conductive materials. The gate electrode 14 can be, for example, a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing, or doping of the substrate. The illustrated gate electrode 14 is formed from n-doped silicon. The thickness of the gate electrode layer ranges for example from about 10 to about 200 nanometers for metal films and in the range of about 1 to about 10 micrometers for polymer conductors.

Typical materials suitable for use as source and drain electrodes 16, 18 include those of the gate electrode materials such as gold, nickel, aluminum, platinum, conducting polymers and conducting inks. In the illustrated example, the source and drain electrodes 16, 18 are formed from an electrically conductive material, such as gold.

Typical thicknesses of source and drain electrodes are about, for example, from about 40 nanometers to about 1 micrometer with the more specific thickness being about 100 to about 400 nanometers.

The dielectric layer 20 generally can be an inorganic material film or an organic polymer film. Illustrative examples of inorganic materials suitable as the gate dielectric layer include silicon oxide, silicon nitride, aluminum oxide, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate)s, epoxy resin and the like. In the example embodiment, silicon oxide ($SiO_2$) may be used as the dielectric layer 20.

The thickness of the dielectric layer 20 is, for example from about 10 nanometers to about 2000 nanometers depending on the dielectric constant of the dielectric material used. A representative thickness of the dielectric layer is from about 100 nanometers to about 500 nanometers. The dielectric layer may have a conductivity that is for example less than about $10^{-12}$ S/cm.

In various embodiments, the gate dielectric layer, the gate electrode, the semiconductor layer, the source electrode, and the drain electrode are formed in any sequence with the gate electrode and the semiconductor layer both contacting the dielectric layer, and the source electrode and the drain electrode both contacting the semiconductor layer. The phrase "in any sequence" includes sequential and simultaneous formation. For example, the source electrode and the drain electrode can be formed simultaneously or sequentially. The composition, fabrication, and operation of field effect transistors are described, for example, in U.S. Pat. No. 6,107,117 the disclosure of which is totally incorporated herein by reference.

For a p-channel OTFT, the source electrode is grounded and a bias voltage of generally, for example, about 0 volts to about −80 volts is applied to the drain electrode to collect the charge carriers transported across the semiconductor channel when a voltage of generally about +20 volts to about −80 volts is applied to the gate electrode.

In some examples, the semiconductor layer 22 incorporating the present copolymer in an OTFT device may have a charge carrier mobility of greater than 0.12 $cm^2/V·s$ to about 0.65 $cm^2/V·s$, from about 0.2 $cm^2/V·s$ to about 0.6 $cm^2/V·s$, or from about 0.3 $cm^2/V·s$ to about 0.55 $cm^2/V·s$. The semiconducting layer may have an average charge carrier mobility of about 0.5 $cm^2/V·s$. Charge carrier mobility was measured by the 4-probe method.

The copolymers of the present disclosure are also advantageously used in organic photovoltaic (PV) devices, such as solar cells. The PV devices advantageously include a copolymer according to the present disclosure. A device of this construction will also have rectifying properties so may also be termed a photodiode. Photoresponsive devices have application as solar cells that generate electricity from light and as photodetectors which measure or detect light.

A PV device may comprise a cathode (electrode), optionally a transition layer, such as an alkali halogenide, for example, lithium fluoride, a photoactive layer, optionally a smoothing layer, an anode (electrode), and a substrate.

The photoactive layer comprises the copolymer of the present disclosure. The photoactive layer may be made of a conjugated copolymer of the present disclosure as an electron donor, and further an acceptor material, for example a fullerene, for example, a functionalized fullerene PCBM, as an electron acceptor. The photoactive layer may also contain a polymeric binder. For example, the polymeric binder may be a semicristalline polymer such as polystyrene (PS), high-density polyethylene (HDPE), polypropylene (PP), polymethylmethacrylate (PMMA) and the like, or mixtures thereof.

For heterojunction solar cells, for example, bulk heterojunction cells, the active layer comprises, for example, a mixture of a copolymer of the present disclosure and a fullerene. The term fullerene refers, for example, to the various cage-like molecules of pure carbon, including Buckminsterfullerene ($C_{60}$) and the related "spherical" fullerenes, as well as carbon nanotubes. The fullerenes may have a broad range of sizes (number of carbon atoms per molecule). Fullerenes may be selected from those known in the art ranging from, for example, about $C_{20}$ to about $C_{1000}$ fullerenes. For example, the fullerene may be from about $C_{60}$ to $C_{96}$, or from about $C_{60}$ to about $C_{70}$. In addition, it is also permissible to utilize chemically modified fullerenes, provided that the modified fullerene retains acceptor-type and electron mobility characteristics. For example, a bulk heterojunction solar cell may comprise a copolymer of the present disclosure as the electron donor and (6,6)-phenyl $C_{61}$-butyric acid methyl ester (PCBM) and/or $C_{71}$-PCBM as the electron acceptor, for example, in a weight ratio of, for example, from about 1:1 to about 1:3. The acceptor material may also be any semiconducting polymer, such as, for example, a copolymer of the present disclosure, provided that the copolymers retain acceptor-type and electron mobility characteristics. In addition, the acceptor material may also be organic small molecules, carbon nanotubes, and inorganic particles (quantum dots, quantum rods, quantum tripods, $TiO_2$, ZnO and the like, or mixtures thereof).

The copolymer of the present disclosure and the fullerene, for example, a functionalized fullerene PCBM, may be mixed with a solvent and applied as a solution, for example, onto a smoothing layer, an anode, or a substrate by, for example, the spin-coating method, the drop casting method, the Langmuir-Blodgett ("LB") method, the ink jet printing method and the dripping method. A squeegee or printing method could also be used to coat larger surfaces with such a photoactive layer.

In the case of forming the photoactive layer by using the spin-coating method, the casting method or ink jet printing method, the coating can be carried out using a solution and/or a dispersion prepared by dissolving or dispersing the composition in a concentration of from 0.01 to 90% by weight in an appropriate organic solvent such as, for example, benzene, toluene, xylene, tetrahydrofurane, methyltetrahydrofurane, N,N-dimethylformamide, acetone, acetonitrile, anisole, dichloromethane, dimethylsulfoxide, chlorobenzene, 1,2-dichlorobenzene and the like, or mixtures thereof. A dispersion agent, such as chlorobenzene, may be used as a solvent.

The PV can also comprise multiple junction solar cells, also known as tandem solar cells, that are processed on top of each other in order to absorb more of the solar spectrum. Such structures are, for example, described in App. Phys. Let. 90, 143512 (2007), Adv. Funct. Mater. 16, 1897-1903 (2006) and WO2004/112161, the disclosures of which are incorporated herein by reference.

A multiple junction solar cell may comprise a cathode (electrode), optionally a transition layer, such as an alkali halogenide, for example, lithium fluoride, a photoactive layer, optionally a smoothing layer, a middle electrode (such as Au, Al, ZnO, $TiO_2$, etc.), optionally an extra electrode to match the energy level, optionally a transition layer, such as an alkali halogenide, such as lithium fluoride, a photoactive layer, optionally a smoothing layer, an anode (electrode), a substrate.

The PV device can also be processed as a fiber as described, for example, in U.S. Patent Application Publication No. 2007/0079,867 and U.S. Pat. No. 7,194,173, the disclosures of which are incorporated herein by reference.

While the example embodiments described herein are in terms of a semiconductor layer for organic thin film transistors, and photoactive layers in organic photovoltaic devices, it is to be appreciated that the copolymeric materials disclosed herein may find application in other electronic devices, such as diodes.

EXAMPLES

Example 1

In a 2-necked, 100 mL round-bottomed flask, about 0.402 g of ((E)-1,2-bis(5-(trimethylstannyl)thiophen-2-yl)ethane) (as M1) was combined with about 0.791 g of (3,6-bis(5-bromothiophen-2-yl)-2,5bis(2-octyldodecyl)pyrrolol[3,4-c] pyrrole-1,4(2H,5H)-dione) (as M2). The flask was fitted with a condenser and flushed with Ar for about 15 minutes. In a separate flask, anhydrous toluene was degassed by bubbling Ar through the solvent for about 30 minutes. The reactants were dissolved in about 20 mL of anhydrous, deoxygenated toluene and the reaction was treated with about 5 mol-% of catalyst $Pd(PPh_3)_4$ (about 0.045 g).

The mixture was then heated to an external temperature of about 95° C. and stirred under an Ar atmosphere. After about 24 hours, the reaction was treated with about 0.776 mmol of 2-bromothiophene and stirred for about an additional 2 hours.

The copolymer was collected by pouring the mixture into a solution of about 50 mL of deionized water and about 450 mL methanol. Any residual copolymer remaining in the flask was dissolved in $CHCl_3$ and added into the methanol solution. The copolymer was collected by vacuum filtration and dried under a vacuum.

The copolymer was then purified by Soxhlet extraction with methanol (about 125 mL, at about 90° C., for about 4 hours), acetone (about 125 mL, at about 85° C., for about 4 h hours) and hexanes (about 125 mL, at about 90° C., for about 18 hours) to remove any impurities and low molecular weight oligomers. The further purified copolymer was extracted into $CHCl_3$ (about 125 mL, at about 90° C., for about 6 hours) and poured into about 500 mL methanol. The copolymer was collected by vacuum filtration and dried under vacuum.

The copolymer was isolated as a dark purple solid and dried under a vacuum for about 18 hours. The molecular weight of the material was determined by conventional gel permeation chromatography (GPC) in $CHCl_3$ (Mn=48,600; Mw=517,000; polydispersity index (PDI)=11). These results indicated that the copolymer aggregates under the GPC conditions (high Mw, high PDI) so the copolymer was reanalyzed by high temperature GPC (150° C.) in 1,2,4-trichlorobenzene (Mn=21,600; Mw=43,500; PDI=2.0).

The copolymer had a formula of:

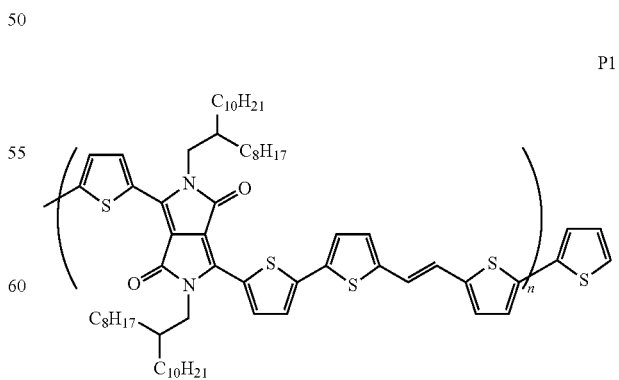

P1 wherein n equals an integer from 1 to about 5,000, such that the above measured Mn and Mw were achieved.

Comparative Example 1

A Comparative Example 1 was prepared to have the formula:

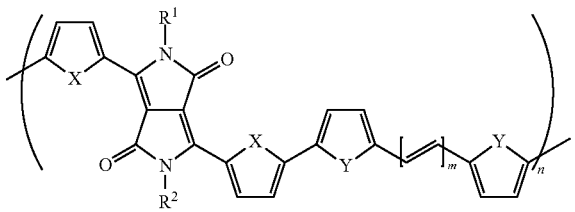

wherein X=Y=S and m=0, and $R^1$ and $R^2$ were the same as in Example 1. The Comparative Example 1 compound was prepared by the Stille polycondensation method.

As shown in FIG. 1, and explained above, the addition of the double bond in the E-configuration helps fine-tune the electronic structure of the copolymer and leads to a red shift in the absorption maximum of the copolymer compared to structural analogue that does not contain a carbon-carbon double bond in the repeat unit. The copolymer which contains the carbon-carbon double bond in the E-configuration (Example 1) is red-shifted by about 30 nm (dashed line) compared to a control sample (Comparative Example 1) (solid line) with no double bond in the repeat unit.

OTFT Fabrication and Testing

The Example 1 compound was fabricated into an organic thin-film transistor on an n-doped silicon wafer with 200-nm silicon oxide as gate dielectric layer. The dielectric surface was modified with octyltrichlorosilane. About 0.6 mg of the Example 1 compound was dissolved in about 2 g of tetrachloroethane solvent to prepare about a 0.3 wt % solution. After filtering with about a 1.0 μm syringe filter, the solution was spin-coated onto the modified silicon wafer at about 1,000 rpm for about 30 seconds. After drying at about 70° C. for about 30 min, and annealing at about 150° C. for about 10 min, gold source/drain electrodes were vacuum evaporated on top of the semiconductor layer to complete the top-contact devices. At least 10 transistors were measured for their charge carrier mobility. Charge carrier mobility was measured using the 4-probe method. The devices showed maximum charge carrier mobility up to 0.65 $cm^2/V \cdot s$ with an average charge mobility around 0.5 $cm^2/V \cdot s$, when measured using the 4-probe method.

Figure 3:
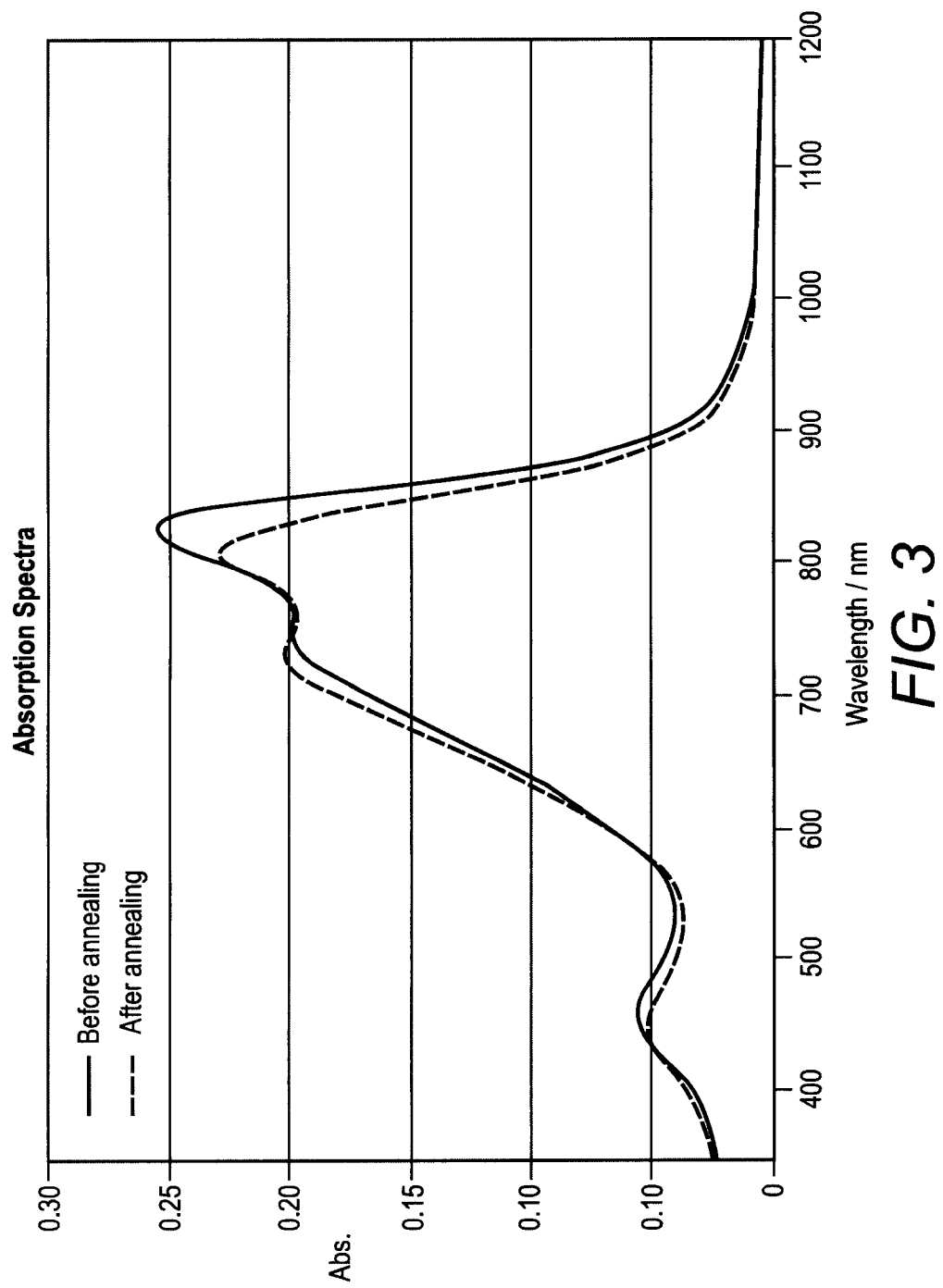
FIG. 3 is a graph comparing the absorption spectra of a copolymer in the E-configuration before and after annealing.

FIG. 3 shows the absorption spectra of the Example 1 compound spin-coated as a thin-film. The absorption maximum is about 835 nm and about 817 nm before and after annealing, respectively. The new copolymer having a vinyl group in the E-configuration in the repeat unit exhibited a small band gap and a fine-tuned HOMO level.

Bottom contact OTFTs were also fabricated by evaporating gold electrodes onto the silane modified silicon oxide first, followed by modifying the electrodes with butanethiol. The semiconductor solution of Example 1 was subsequently deposited by spin coating. The devices showed a charge carrier mobility about 0.44 $cm^2/V \cdot s$, which is very close to top-contact OTFTs. The results indicated a good energy level matching of the semiconductor with the electrode materials.

It will be appreciated that variations of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A copolymer comprising a structure represented by:

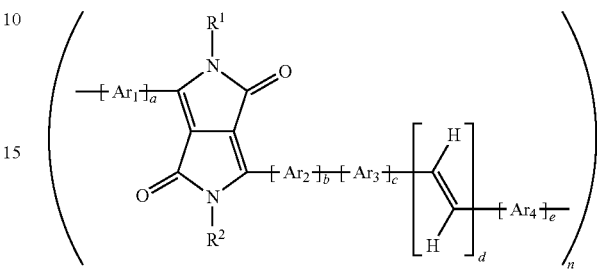

wherein $R^1$ and $R^2$ are independently selected from a hydrogen, a substituted or unsubstituted alkyl group, a substituted or unsubstituted aryl group, or a substituted or unsubstituted heteroaryl group;

$Ar_1$ and $Ar_2$ are independently a heteroaromatic group comprising about 4 to about 30 carbon atoms, and can be optionally substituted;

a and b are each 1;

$Ar_3$ and $Ar_4$ are independently selected from the group consisting of:

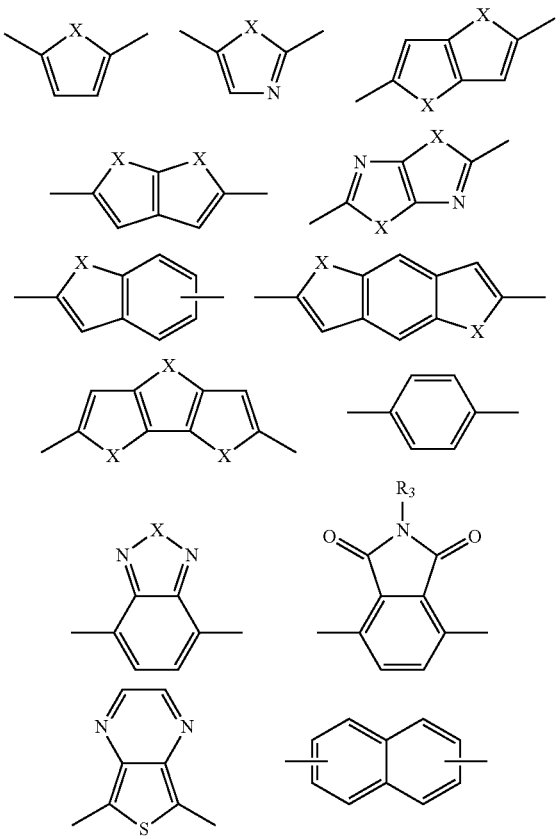

-continued

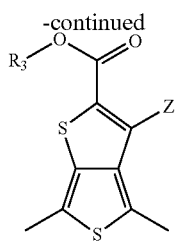

which can be optionally substituted with an alkyl or halogen, wherein
 X is independently O, S or Se;
 Z is H or F; and
 $R_3$ is an alkyl or substituted alkyl group;
 c and e are each 1;
 d is 1 to 4 and the carbon-carbon double bond is in the E-configuration; and
 n represents a number from 2 to about 5,000.

2. The copolymer according to claim 1, wherein $Ar_1$ and $Ar_2$ are independently selected from the group consisting of:

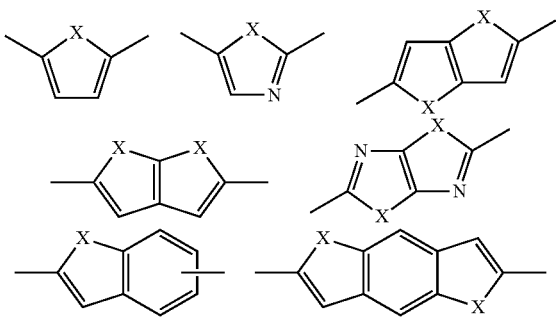

-continued

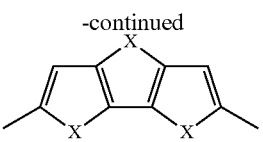

wherein X is independently O, S or Se.

3. The copolymer according to claim 1, wherein the copolymer is represented by:

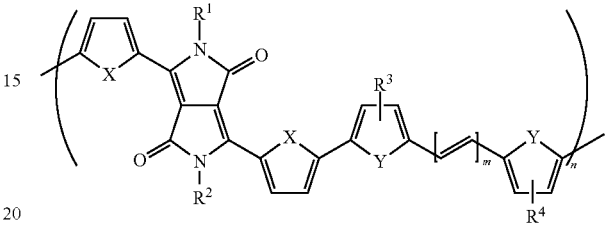

wherein, $R^1$, $R^2$, $R^3$ and $R^4$ are independently selected from a hydrogen, a substituted or unsubstituted alkyl group, a substituted or unsubstituted aryl group, a substituted or unsubstituted heteroaryl group or a halogen;
 X and Y are independently selected from O, S or Se;
 m represents a number from 1 to about 4, wherein the carbon-carbon double bond is in the E-configuration; and
 n represents a number from 2 to about 5,000.

4. The copolymer according to claim 3, wherein X and Y are the same.

5. The copolymer according to claim 3, wherein X and Y are the same and m is 1.

6. The copolymer according to claim 1 where in the copolymer is selected from the group consisting of:

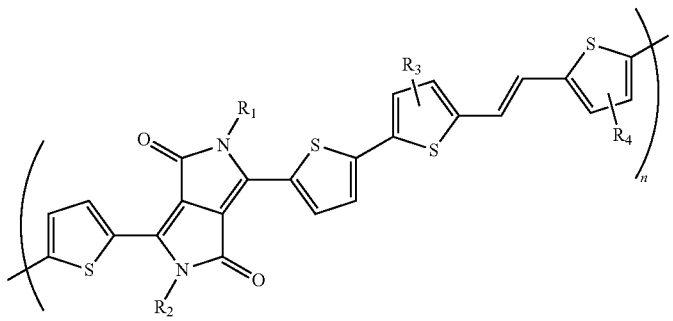

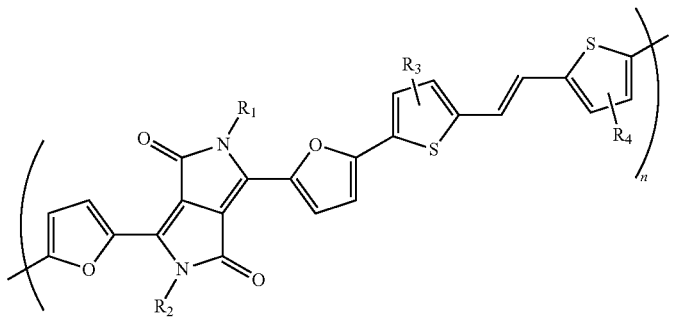

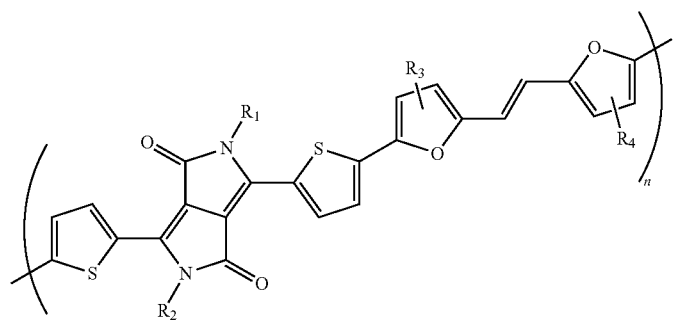
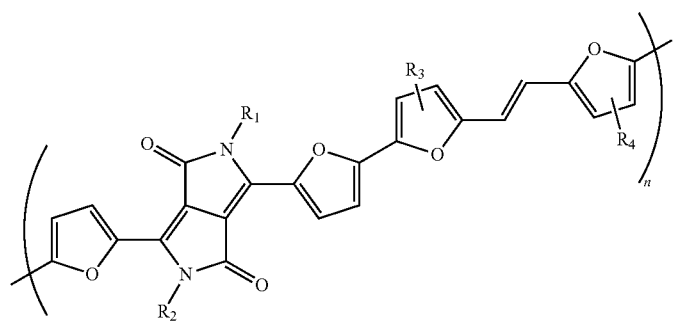
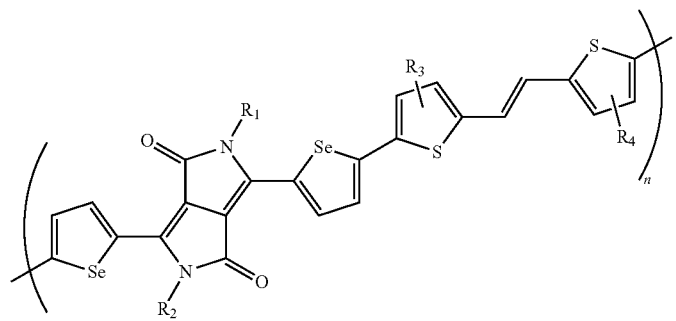
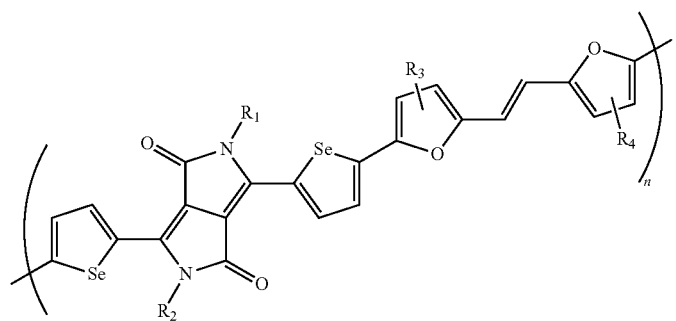
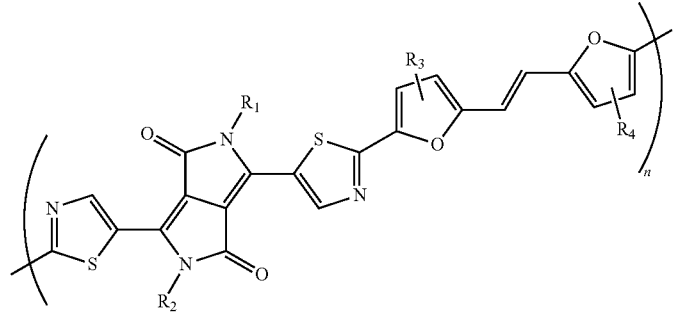

-continued
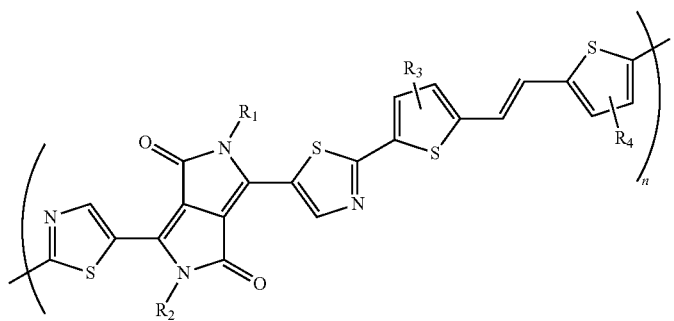
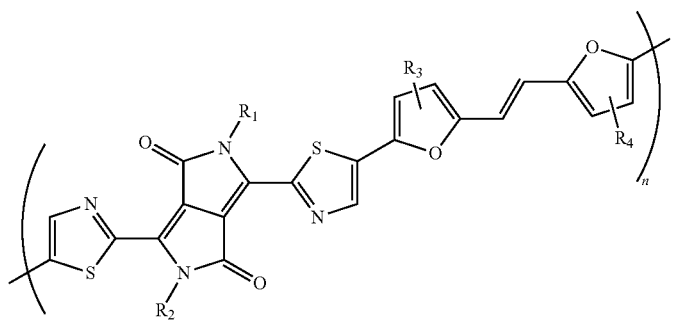
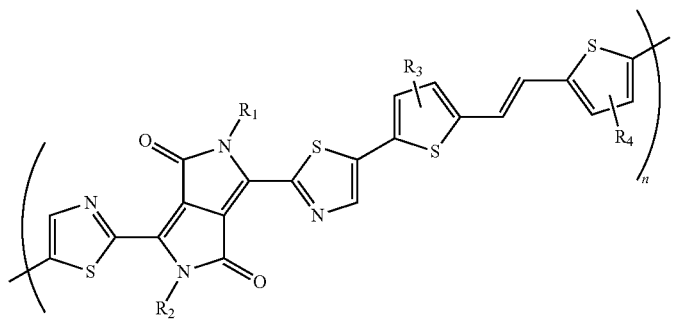
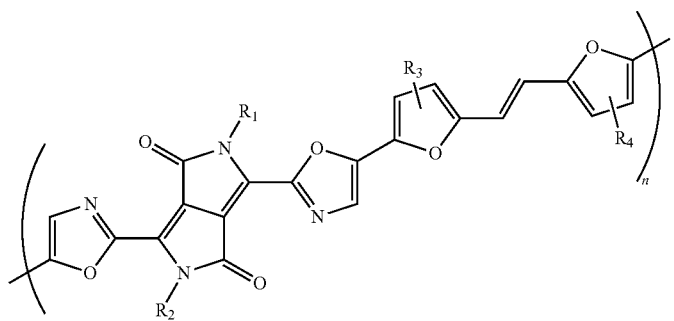
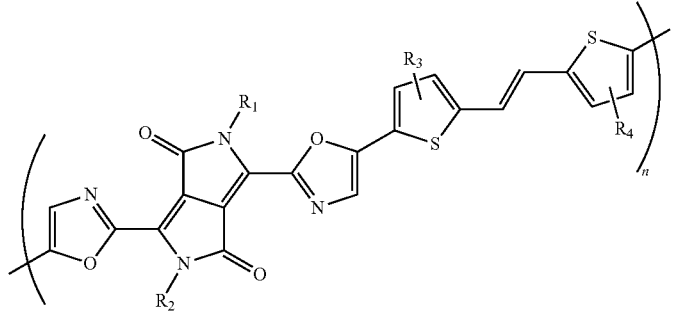

-continued
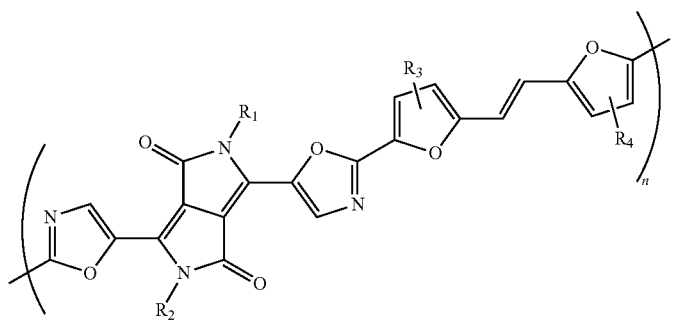
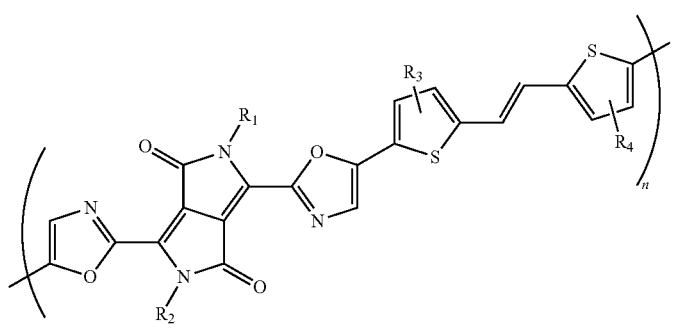
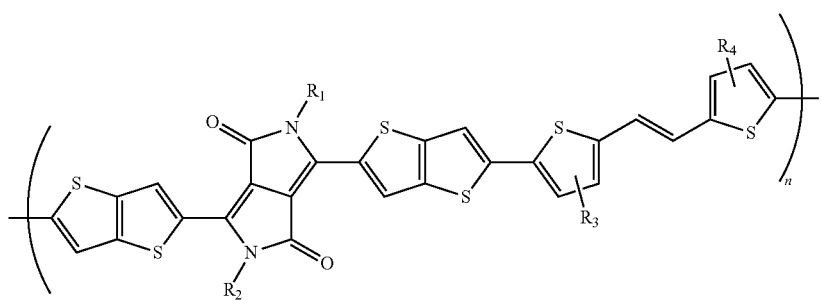
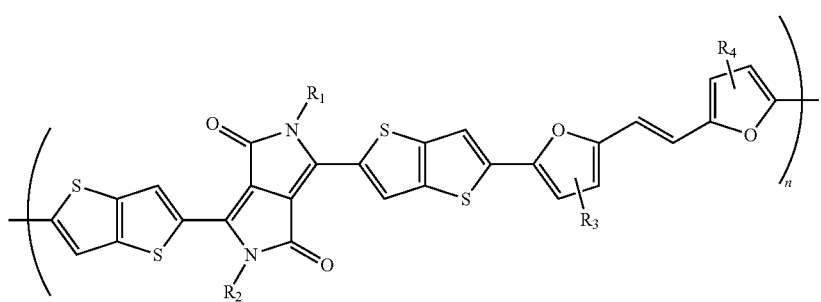
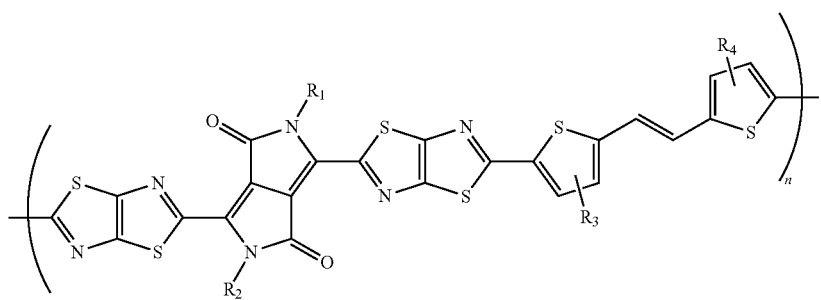
and

-continued

[chemical structure]

7. A method of forming a copolymer comprising mixing, in an environment that is substantially free of oxygen gas, a first compound of the formula:

[chemical structure]

wherein the carbon-carbon double bond is in the E-configuration, d represents a number from 1 to about 4, and M represents:

[chemical structures]

Sn(Me)$_3$, Sn(Bu)$_3$, or B(OH)$_2$,
with a second compound of the formula:

[chemical structure]

wherein R$^1$ and R$^2$ are independently selected from a hydrogen, a substituted or unsubstituted alkyl group, a substituted or unsubstituted aryl group, or a substituted or unsubstituted heteroaryl group, X and Y are independently selected from O, S or Se,
adding a solvent that is substantially free of oxygen gas to dissolve the mixture;
adding an aryl bromide or heteroaryl bromide to the mixture and allowing the first compound to react with the second compound to form the copolymer; and
collecting the copolymer.

8. The method according to claim 7, wherein after the collecting of the copolymer, the method further includes purifying the copolymer.

9. A semiconductor composition, the semiconducting composition comprising a solvent and a copolymer represented by the structure:

[chemical structure]

wherein R$^1$ and R$^2$ are independently selected from a hydrogen, a substituted or unsubstituted alkyl group, a substituted or unsubstituted aryl group, or a substituted or unsubstituted heteroaryl group;

Ar$_1$ and Ar$_2$ are independently a heteroaromatic group comprising about 4 to about 30 carbon atoms, and can be optionally substituted;

a and b are each 1;

Ar$_3$ and Ar$_4$ are independently selected from the group consisting of:

[chemical structures]

-continued

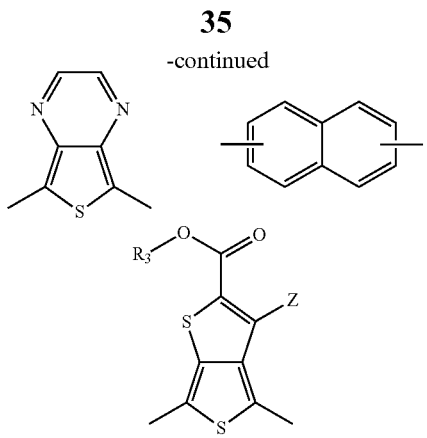

which can be optionally substituted with an alkyl or halogen, wherein
X is independently O, S or Se;
Z is H or F; and
$R_3$ is an alkyl or substituted alkyl group;
c and e are each 1;
d is 1 to 4 and the carbon-carbon double bond is in the E-configuration; and
n represents a number from 2 to about 5,000.

10. The semiconductor composition according to claim 9, wherein $Ar_1$ and $Ar_2$ are independently selected from the group consisting of:

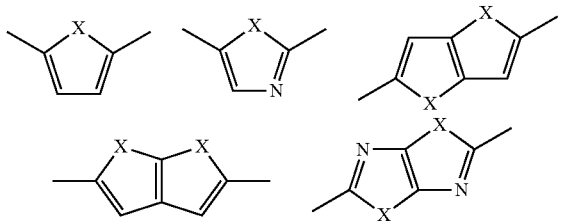

-continued

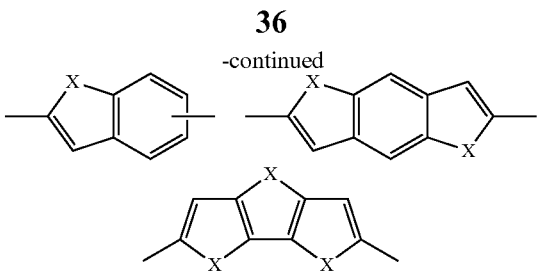

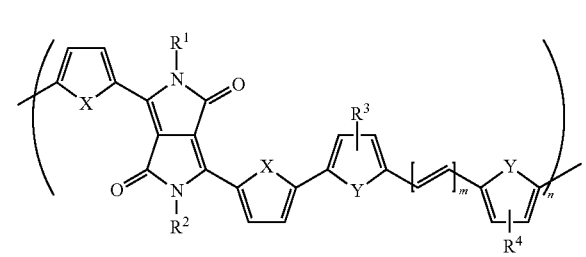

wherein X is independently O, S or Se.

11. The semiconductor layer according to claim 9, wherein the copolymer is represented by:

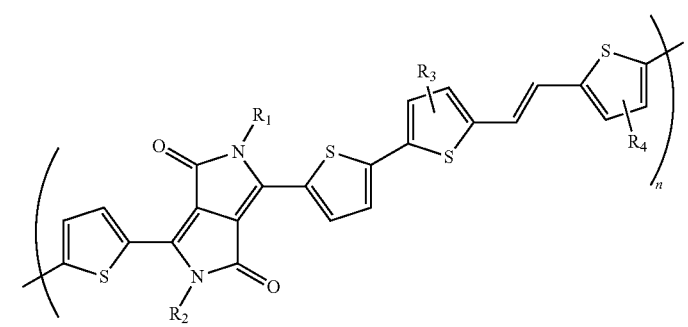

wherein, $R^1$, $R^2$, $R^3$ and $R^4$ are independently selected from a hydrogen, a substituted or unsubstituted alkyl group, a substituted or unsubstituted aryl group, a substituted or unsubstituted heteroaryl group or a halogen;
X and Y are independently selected from O, S or Se;
m represents a number from 1 to about 4, wherein the carbon-carbon double bond is in the E-configuration; and
n represents a number from 2 to about 5,000.

12. The semiconductor composition according to claim 11, wherein X and Y are the same.

13. The semiconductor composition according to claim 11, wherein X and Y are the same and m is 1.

14. The semiconductor composition according to claim 9, wherein the copolymer is selected from the group consisting of:

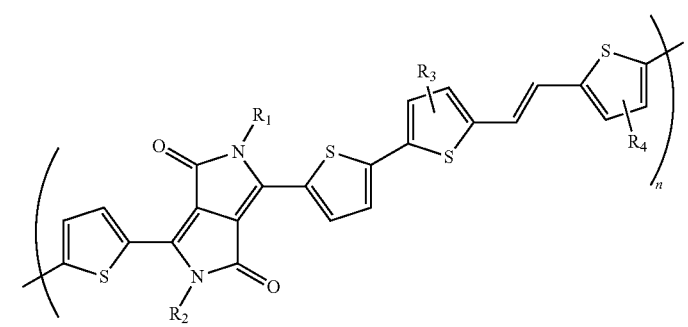

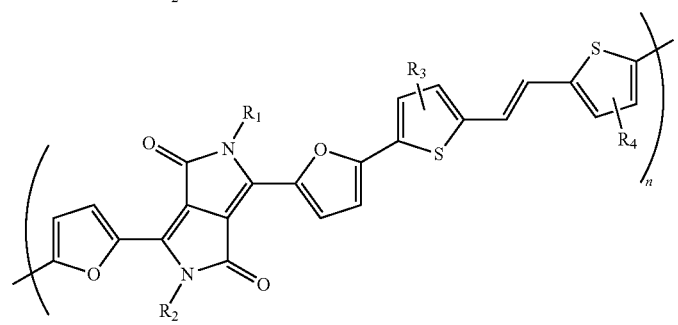

-continued
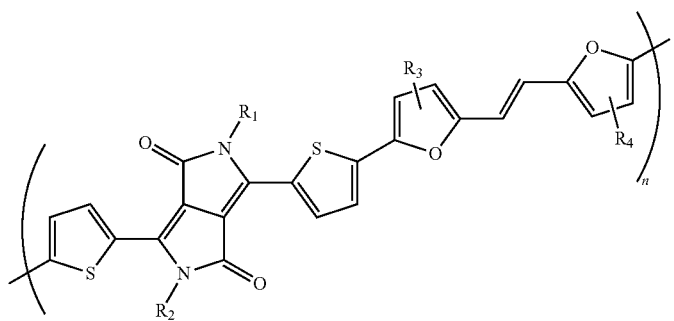
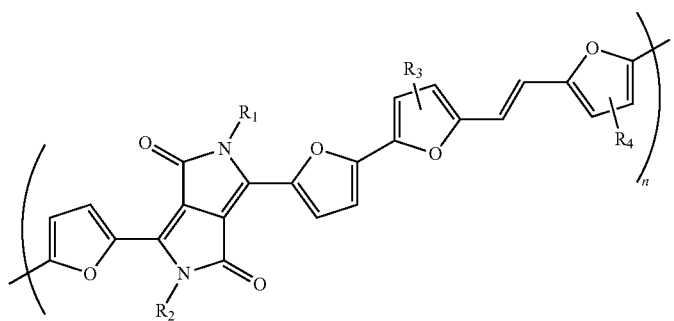
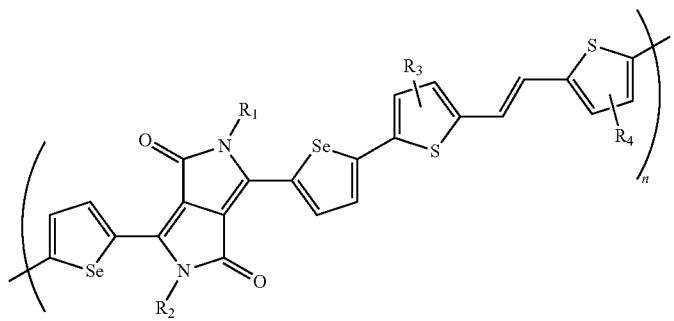
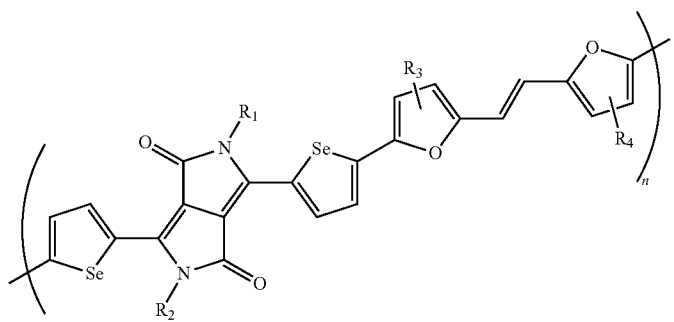
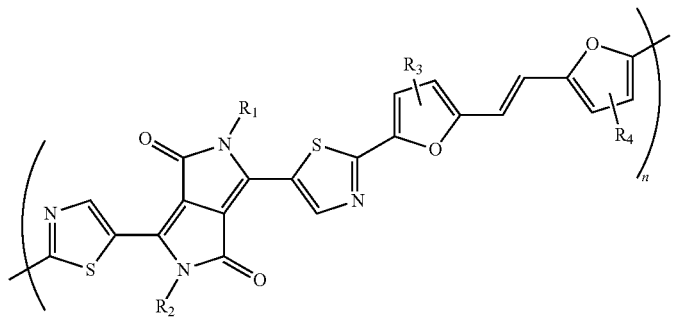

-continued
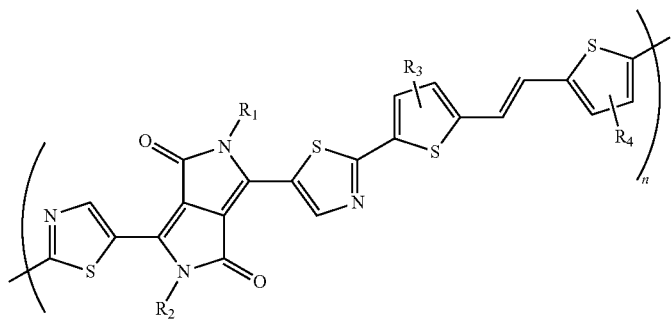
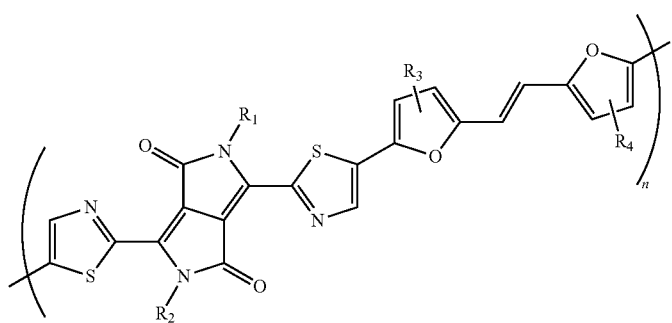
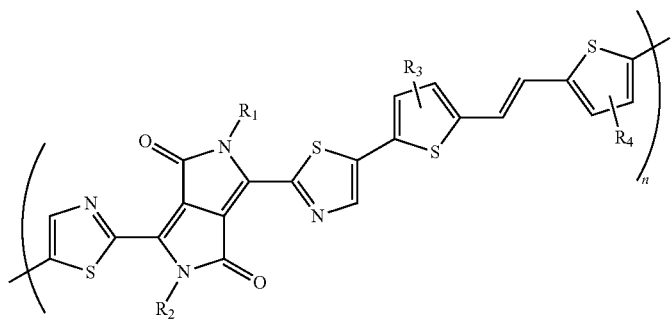
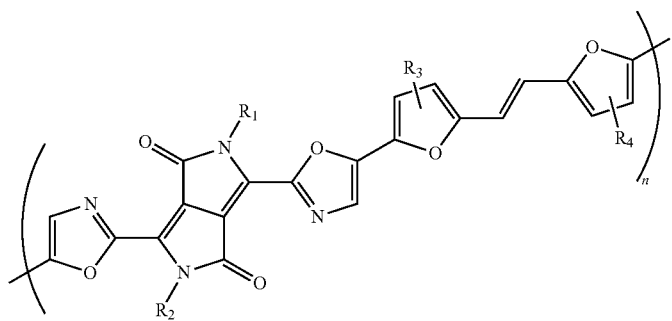
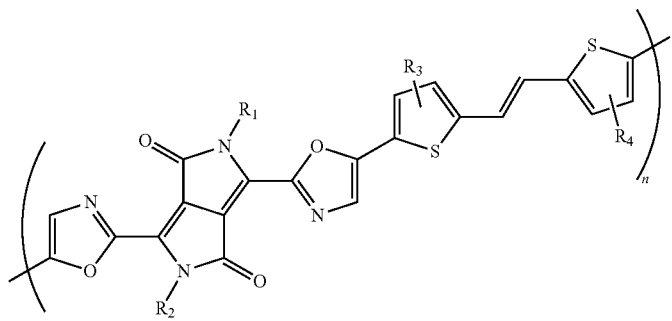

-continued
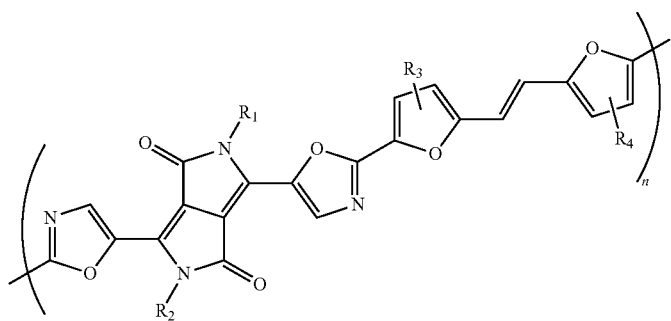
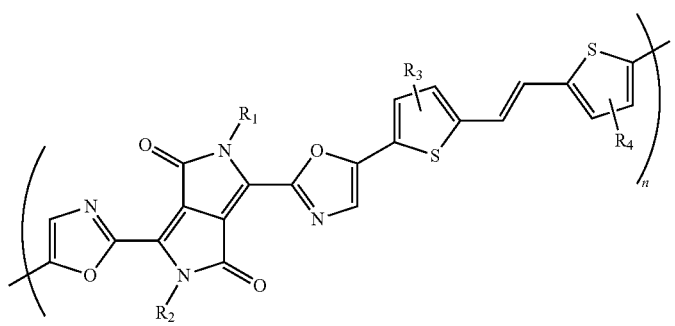
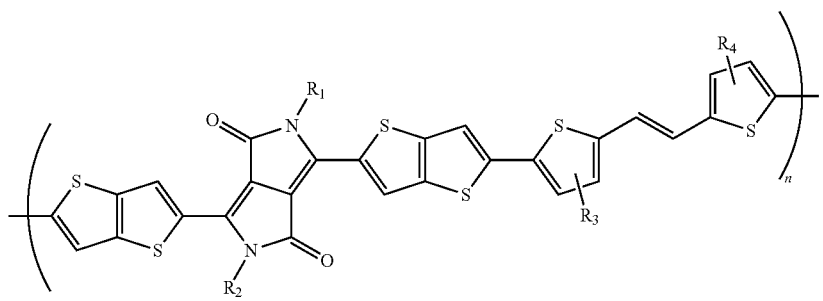
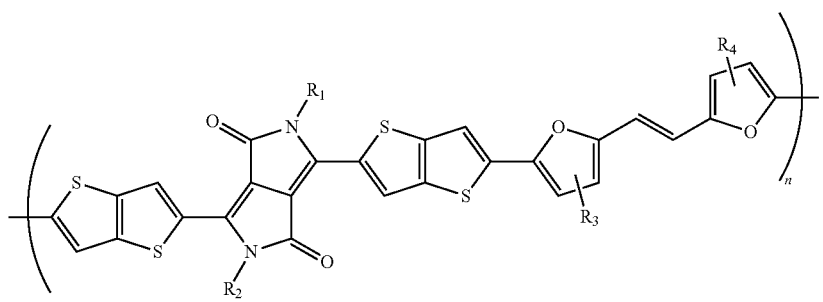
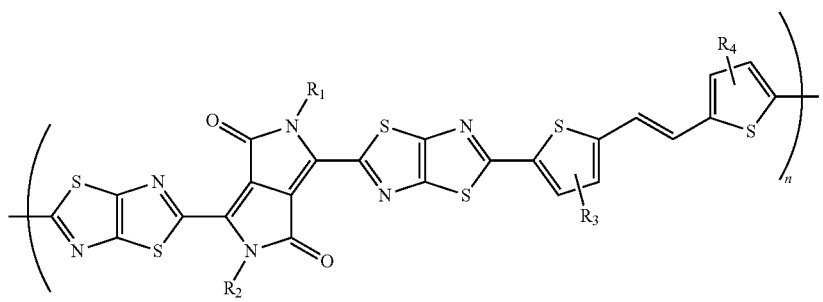 and

-continued

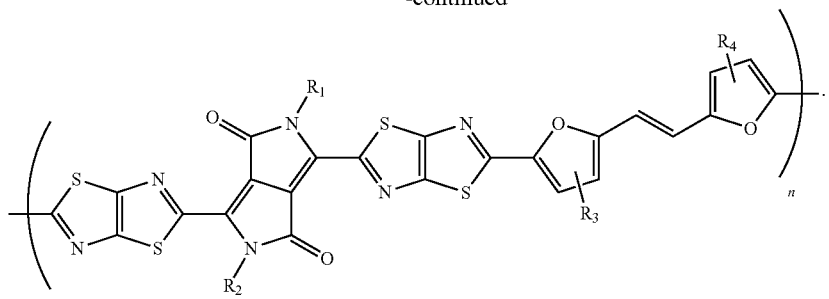

15. An electronic device, comprising as a layer or coating in the electronic device a copolymer represented by the structure:

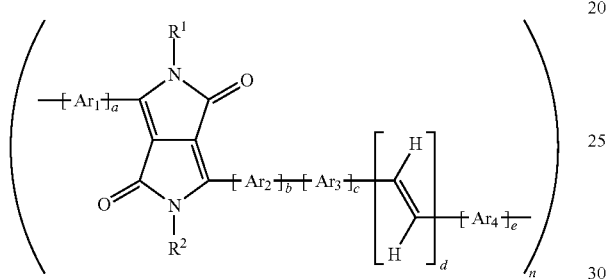

wherein R¹ and R² are independently selected from a hydrogen, a substituted or unsubstituted alkyl group, a substituted or unsubstituted aryl group, or a substituted or unsubstituted heteroaryl group;

Ar₁ and Ar₂ are independently a heteroaromatic group comprising about 4 to about 30 carbon atoms, and can be optionally substituted;

a and b are each 1;

Ar₃ and Ar₄ are independently selected from the group consisting of:

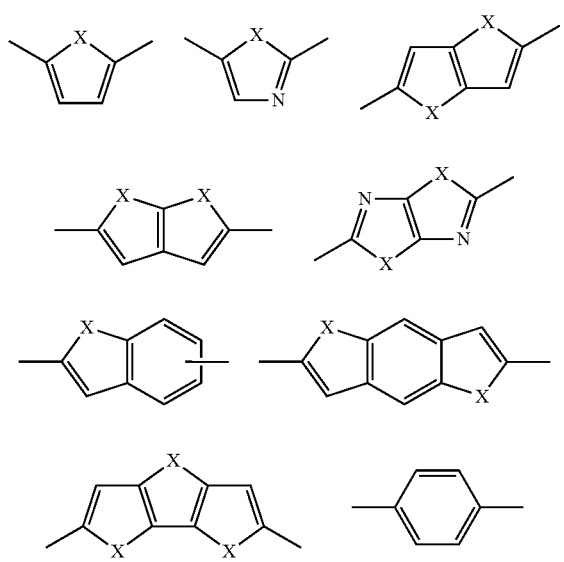

-continued

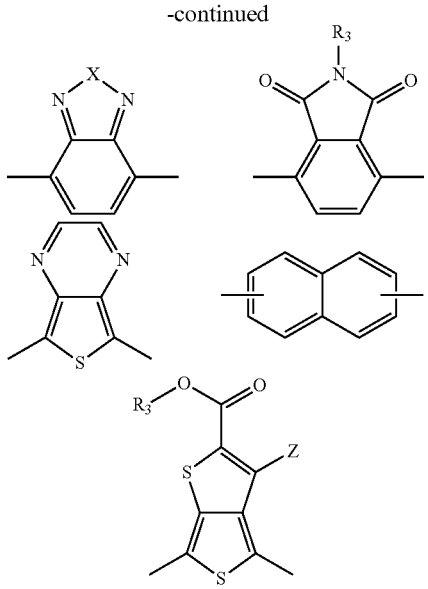

which can be optionally substituted with an alkyl or halogen, wherein

X is independently O, S or Se;

Z is H or F; and

R₃ is an alkyl or substituted alkyl group;

c and e are each 1;

d is 1 to 4 and the carbon-carbon double bond is in the E-configuration; and n represents a number from 2 to about 5,000.

16. The electronic device according to claim 15, wherein Ar₁ and Ar₂ are independently selected from the group consisting of:

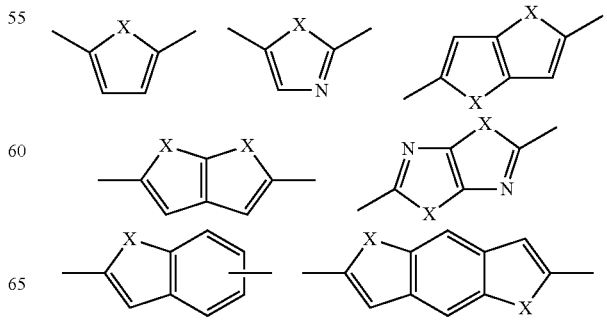

-continued

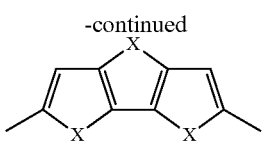

wherein X is independently O, S or Se.

17. The electronic device according to claim 15, wherein the copolymer is represented by:

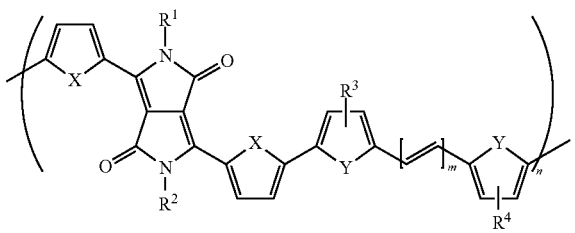

wherein, $R^1$, $R^2$, $R^3$ and $R^4$ are independently selected from a hydrogen, a substituted or unsubstituted alkyl group, a substituted or unsubstituted aryl group, a substituted or unsubstituted heteroaryl group or a halogen;

X and Y are independently selected from O, S or Se;

m represents a number from 1 to about 4, wherein the carbon-carbon double bond is in the E-configuration; and n represents a number from 2 to about 5,000.

18. The electronic device according to claim 15, wherein the copolymer has a charge carrier mobility of greater than 0.12 cm²/V·s to about 0.65 cm²/V·s.

19. The electronic device according to claim 15, further comprising a semiconducting layer, wherein the semiconducting layer has an average charge carrier mobility of about 0.5 cm²/V·s.

20. The electronic device according to claim 15, wherein the electronic device is an organic thin film transistor.

21. The electronic device according to claim 15, wherein the electronic device is a photovoltaic device.

* * * * *